(12) United States Patent
Mase et al.

(10) Patent No.: US 11,215,698 B2
(45) Date of Patent: Jan. 4, 2022

(54) DISTANCE SENSOR AND DISTANCE IMAGE SENSOR

(71) Applicant: HAMAMATSU PHOTONICS K.K., Hamamatsu (JP)

(72) Inventors: Mitsuhito Mase, Hamamatsu (JP); Jun Hiramitsu, Hamamatsu (JP); Akihiro Shimada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 415 days.

(21) Appl. No.: 16/322,664

(22) PCT Filed: May 30, 2017

(86) PCT No.: PCT/JP2017/020055
§ 371 (c)(1),
(2) Date: Feb. 1, 2019

(87) PCT Pub. No.: WO2018/042785
PCT Pub. Date: Mar. 8, 2018

(65) Prior Publication Data
US 2021/0132199 A1 May 6, 2021

(30) Foreign Application Priority Data
Aug. 29, 2016 (JP) .................... 2016-166683

(51) Int. Cl.
*H01L 27/00* (2006.01)
*G01S 7/481* (2006.01)
(Continued)

(52) U.S. Cl.
CPC ............ *G01S 7/481* (2013.01); *G01S 7/4863* (2013.01); *G01S 17/89* (2013.01);
(Continued)

(58) Field of Classification Search
CPC .......... H01L 27/14603; H01L 27/1462; H01L 27/14638; G01S 7/4863
See application file for complete search history.

(56) References Cited

U.S. PATENT DOCUMENTS

| 6,278,145 B1 * | 8/2001 | Kato ................ H01L 27/14685 257/292 |
| 2007/0138590 A1 | 6/2007 | Wells et al. |
| 2016/0225922 A1 | 8/2016 | Akkaya et al. |

FOREIGN PATENT DOCUMENTS

| JP | S48-32946 B1 | 10/1973 |
| JP | 2007-526448 A | 9/2007 |

(Continued)

OTHER PUBLICATIONS

International Preliminary Report on Patentability dated Mar. 14, 2019 for PCT/JP2017/020055.

*Primary Examiner* — Kevin K Pyo
(74) *Attorney, Agent, or Firm* — Faegre Drinker Biddle & Reath LLP

(57) ABSTRACT

A range sensor includes a silicon substrate and a transfer electrode. The silicon substrate includes a first principal surface and a second principal surface opposing each other. The silicon substrate is provided with a charge generation region configured to generate a charge in response to incident light and a charge collection region configured to collect charges from the charge generation region, on the first principal surface side. The transfer electrode is disposed between the charge generation region and the charge collection region on the first principal surface. A region of the second principal surface corresponding at least to the charge generation region is formed with a plurality of protrusions. The plurality of protrusions includes a slope inclined with respect to a thickness direction of the silicon substrate. A (Continued)

(111) plane of the silicon substrate is exposed as the slope at the protrusion. A height of the protrusion is 200 nm or more.

5 Claims, 22 Drawing Sheets

(51) Int. Cl.
 *H04N 5/369* (2011.01)
 *G01S 17/89* (2020.01)
 *G01S 7/4863* (2020.01)
 *H01L 27/146* (2006.01)
(52) U.S. Cl.
 CPC .. *H01L 27/14603* (2013.01); *H01L 27/14645* (2013.01); *H04N 5/369* (2013.01)

(56) References Cited

FOREIGN PATENT DOCUMENTS

| | | |
|---|---|---|
| JP | 2011-215073 A | 10/2011 |
| JP | 2011-222893 A | 11/2011 |
| JP | 2013-33864 A | 2/2013 |
| JP | 2015-50223 A | 3/2015 |
| JP | 2015-520939 A | 7/2015 |
| JP | 2015-185808 A | 10/2015 |
| JP | 2015-220313 A | 12/2015 |
| KR | 10-2006-0112351 A | 11/2006 |
| WO | WO-2004/114369 A2 | 12/2004 |
| WO | WO-2013/155011 A1 | 10/2013 |

\* cited by examiner (a)

(b)

(a)

(b)

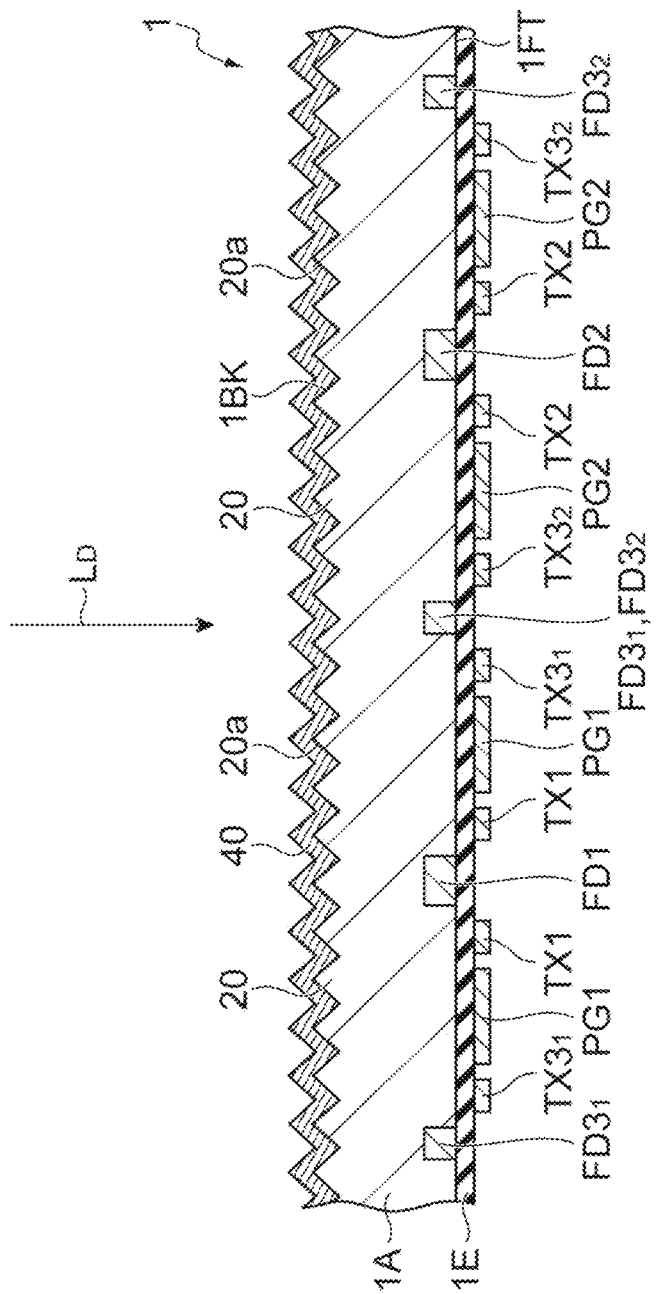

DISTANCE SENSOR AND DISTANCE IMAGE SENSOR

TECHNICAL FIELD

The present invention relates to a range sensor and a range image sensor.

BACKGROUND ART

Known range sensors (range image sensors) include a silicon substrate and a transfer electrode (e.g., see Patent Document 1). The silicon substrate includes a first principal surface and a second principal surface opposing each other. The silicon substrate is provided with a charge generation region configured to generate a charge in response to incident light and a charge collection region configured to collect the charge from the charge generation region, on the first principal surface side. The transfer electrode is disposed between the charge generation region and the charge collection region on the first principal surface. The transfer electrode causes the charge to flow from the charge generation region into the charge collection region in response to an inputted signal.

CITATION LIST

Patent Literature

Patent Document 1: Japanese Unexamined Patent Publication No. 2007-526448

SUMMARY OF INVENTION

Technical Problem

The range sensor (range image sensor) described in Patent Document 1 has room for improvement in spectral response in an ultraviolet wavelength band.

An object of one aspect of the present invention is to provide a range sensor and a range image sensor enhancing spectral response in an ultraviolet wavelength band.

Solution to Problem

One aspect of the present invention is a range sensor including a silicon substrate and a transfer electrode. The silicon substrate includes a first principal surface and a second principal surface opposing each other. The silicon substrate is provided with a charge generation region configured to generate a charge in response to incident light and a charge collection region configured to collect the charge from the charge generation region, on the first principal surface side. The transfer electrode is disposed between the charge generation region and the charge collection region on the first principal surface. The transfer electrode is configured to cause the charge to flow from the charge generation region into the charge collection region in response to an inputted signal. A region of the second principal surface corresponding at least to the charge generation region is formed with a plurality of protrusions. The plurality of protrusions includes a slope inclined with respect to a thickness direction of the silicon substrate. A (111) plane of the silicon substrate is exposed as a slope at the protrusion. A height of the protrusion is equal to or more than 200 nm.

In the range sensor according to the one aspect of the present invention, the plurality of protrusions formed on the second principal surface includes the slope inclined with respect to the thickness direction of the silicon substrate. When light is incident on the silicon substrate from the second principal surface, light is partially is reflected on the second principal surface side of the range sensor. The slope is inclined with respect to the thickness direction of the silicon substrate. Therefore, for example, light reflected on the slope side of one protrusion is directed to the slope side of a protrusion adjacent to the one protrusion, and is incident on the silicon substrate from the slope of the adjacent protrusion.

Since the (111) plane of the silicon substrate is exposed as the slope at the protrusion, light incident on the silicon substrate from the slope tends to be taken into the silicon substrate. Since the height of the protrusion is equal to or more than 200 nm, a surface area of the slope is large. Therefore, a large amount of light incident on the slope is taken into the silicon substrate.

Light in the ultraviolet wavelength region has a large absorption coefficient by silicon. Therefore, light in the ultraviolet wavelength region is absorbed in a region close to the second principal surface of the silicon substrate. In the range sensor according to the one aspect, the (111) plane of the silicon substrate is exposed at the protrusion formed on the silicon substrate. Consequently, absorption of light in the region close to the second principal surface is not hindered.

From the above reasons, the range sensor according to the one aspect enhances spectral response in the ultraviolet wavelength band.

The range sensor according to the one aspect may further include a silicon oxide film disposed on the second principal surface and configured to transmit incident light. In this case, since the silicon oxide film functions as an anti-reflection film, light tends to be further taken in by the silicon substrate. Therefore, this embodiment further enhances the spectral response in an ultraviolet wavelength band.

The range sensor according to the one aspect may further include an aluminum oxide film disposed on the second principal surface and configured to transmit incident light. In this case, a fixed charge of a predetermined polarity exists on a light incident surface side of the silicon substrate due to the aluminum oxide film. A region on the second principal surface side of the silicon substrate where the fixed charge of the predetermined polarity exists functions as an accumulation layer.

Since the accumulation layer recombines unnecessary charges that are generated irrespective of light on the second principal surface side, a dark current is reduced. The accumulation layer suppresses carriers generated by light near the second principal surface of the silicon substrate from being trapped on the second principal surface. The accumulation layer suppresses trapping, on the second principal surface, of carriers generated by light near the second principal surface of the silicon substrate. Therefore, the charges generated by the light efficiently migrate to the first principal surface side of the silicon substrate. Consequently, according to this embodiment, the photodetection sensitivity is enhanced.

The silicon substrate may include a first substrate region provided with the charge generation region and the charge collection region, and a second substrate region having a higher impurity concentration than the first substrate region and provided on the second principal surface side. In this case, the slope of the protrusion may be included in a surface of the second substrate region. According to this embodiment, the second substrate region functions as an accumulation layer. Therefore, as described above, the photodetection sensitivity is enhanced.

The transfer electrode may have a ring shape and may be disposed to surround the charge collection region when viewed from a direction orthogonal to the first principal surface. In this case, since the charge is transferred from outside the transfer electrode to the charge collection region located inside the transfer electrode, the charge collection region collects a lot of charge. Consequently, this embodiment obtains a distance output with a good SN ratio.

The range sensor according to the one aspect may further include a film disposed on the second principal surface, configured to transmit incident light, and containing boron. In this case, the range sensor suppresses deterioration of the spectral response in the ultraviolet wavelength band.

A range image sensor according to one aspect of the present invention includes a silicon substrate provided with an imaging region including a plurality of units disposed one-dimensionally or two-dimensionally. Each of the units is the range sensor described above.

The range image sensor according to the one aspect enhances the spectral response in the ultraviolet wavelength band, as described above.

Advantageous Effects of Invention

According to the one aspect of the present invention, there is provided a range sensor and a range image sensor enhancing spectral response in an ultraviolet wavelength band.

BRIEF DESCRIPTION OF DRAWINGS

FIG. 22 is a diagram illustrating a cross-sectional configuration of each pixel of a range image sensor according to a modification.

DESCRIPTION OF EMBODIMENTS

Figure 1:
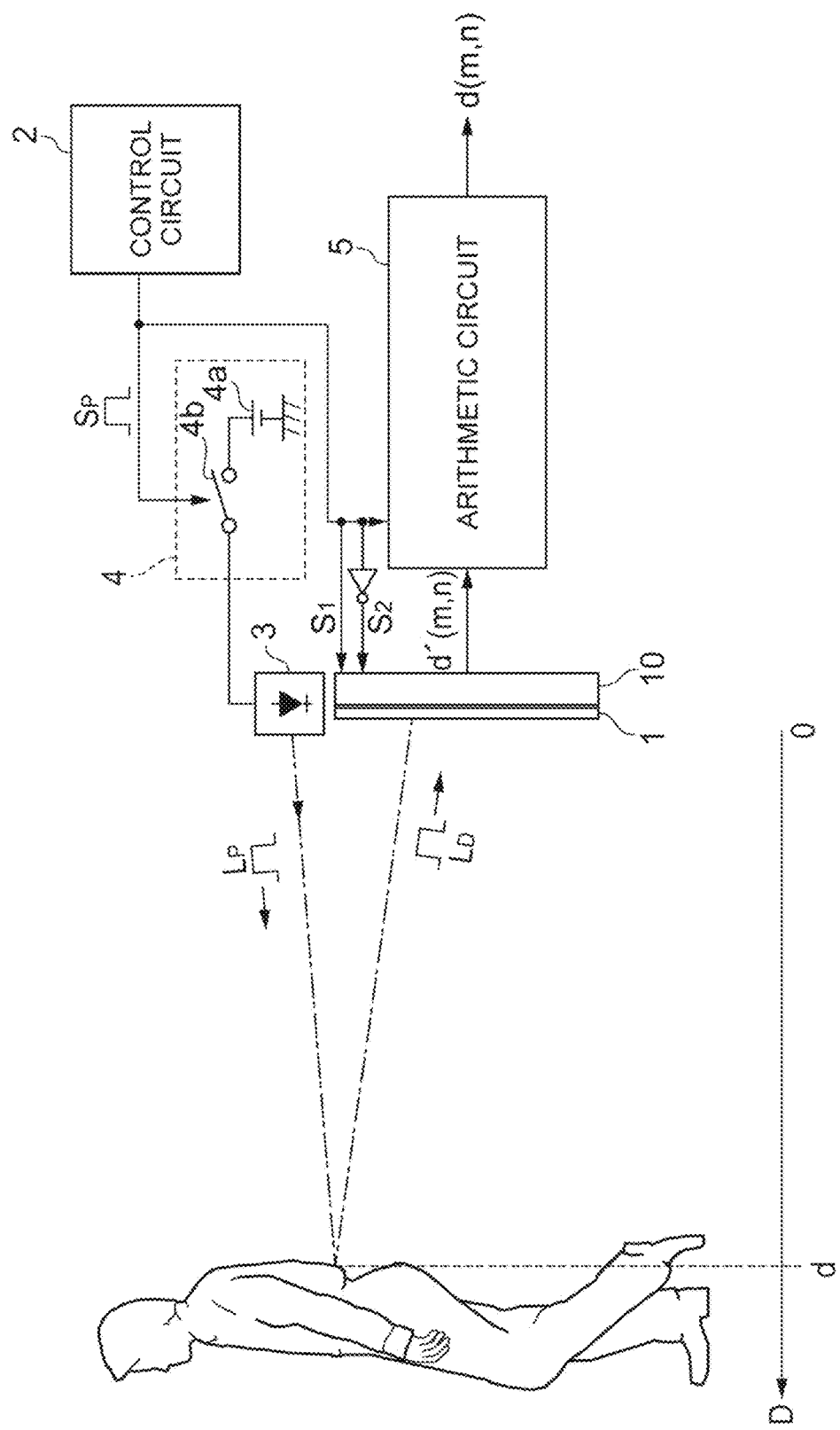
FIG. 1 is an explanatory diagram illustrating a configuration of a distance measuring device.

Hereinafter, embodiments of the present invention will be described in detail with reference to the accompanying drawings. In the description, the same reference numerals are used for the same elements or elements having the same function, and redundant explanations will be omitted.

FIG. 1 is an explanatory diagram illustrating a configuration of a distance measuring device.

This distance measuring device includes a range image sensor 1, a light source 3, a drive circuit 4, a control circuit 2, and an arithmetic circuit 5. The drive circuit 4 provides the light source 3 with a drive signal $S_P$. The control circuit 2 provides first and second transfer electrodes (TX1, TX2: see FIG. 4) included in each pixel of the range image sensor 1 with a first transfer signal $S_1$ and a second transfer signal $S_2$ synchronized with the drive signal $S_P$. From a signal d'(m, n) indicating distance information read from first and second semiconductor regions (FD1, FD2: see FIG. 4) of the range image sensor 1, the arithmetic circuit 5 calculates a distance to an object. Let d be a distance in a horizontal direction D from the range image sensor 1 to the object. The control circuit 2 also outputs third transfer signals $S_{31}$ and $S_{32}$, which will be described later. The drive signal $S_P$, the first transfer signal $S_1$, and the second transfer signal $S_2$ are pulse signals.

The control circuit 2 feeds the drive signal $S_P$ to a switch 4b of the drive circuit 4. The light source 3 is connected to a power source 4a via the switch 4b. When the drive signal $S_P$ is inputted to the switch 4b, a drive current having the same waveform as that of the drive signal $S_P$ is supplied to the light source 3, and the light source 3 emits pulsed light $L_P$ as probe light for measuring distance.

When the pulsed light $L_P$ is irradiated onto the object, the pulsed light is reflected by the object. The reflected pulsed light is incident on the range image sensor 1 as reflected light $L_D$. The range image sensor 1 outputs a detection signal $S_D$. The detection signal $S_D$ is also a pulse signal.

The range image sensor 1 is disposed on a wiring substrate 10. Via wiring on the wiring substrate 10, the signal d'(m, n) having distance information is outputted from each pixel of the range image sensor 1. The detection signal $S_D$ includes the signal d'(m, n).

A waveform of the drive signal $S_P$ is a square wave with a period T. Assuming that a high level is "1" and a low level is "0", a voltage V(t) of the drive signal $S_r$ is given by the following expressions.

Drive signal $S_P$:

$V(t)=1$ (where $0<t<(T/2)$)

$V(t)=0$ (where $(T/2)<t<T$)

$V(t+T)=V(t)$

Waveforms of the first transfer signal $S_1$ and the second transfer signal $S_2$ are square waves with a period T. Voltages V(t) of the first transfer signal $S_1$ and the second transfer signal $S_2$ are given by the following expressions.

First transfer signal $S_1$:

$V(t)=1$ (where $0<t<(T/2)$)

$V(t)=0$ (where $(T/2)<t<T$)

$V(t+T)=V(t)$

Second transfer signal $S_2$ (=inversion of $S_1$):

$V(t)=0$ (where $0<t<(T/2)$)

$V(t)=1$ (where $(T/2)<t<T$)

$V(t+T)=V(t)$

The signals $S_P$, $S_1$, $S_2$, and $S_D$ all have a pulse period of $2\times T_P$. Let $q_1$ be a charge quantity generated in the range image sensor 1 with the first transfer signal $S_1$ and the detection signal $S_D$ both being "1". Let $q_2$ be a charge quantity generated in the range image sensor 1 with the second transfer signal $S_2$ and the detection signal $S_D$ both being "1".

A phase difference between the first transfer signal $S_1$ and the detection signal $S_D$ is proportional to the charge quantity $q_2$ generated in the range image sensor 1 in an overlap period in which the second transfer signal $S_2$ and the detection signal $S_D$ are "1". The charge quantity $q_2$ is a charge quantity that is generated in a period in which a logical conjunction of the second transfer signal $S_2$ and the detection signal $S_D$ is "1".

Assuming that a total charge quantity generated within one pixel is $q_1+q_2$ and a half-period pulse width of the drive signal $S_P$ is $T_P$, the detection signal $S_D$ lags behind the drive signal $S_P$ by a period of $\Delta t = T_P \times q_2/(q_1+q_2)$. A flight time $\Delta t$ of one pulsed light is given by $\Delta t = 2d/c$, where d is a distance to the object and c is the light speed. Therefore, when two charge quantities $(q_1, q_2)$ are outputted as the signal d'(m, n) having distance information from a specific pixel, the arithmetic circuit 5 calculates the distance $d=(c\times\Delta t)/2=c\times T_P \times q_2/(2\times(q_1+q_2))$ to the object, based on the inputted charge quantities $q_1$ and $q_2$ and the half-period pulse width $T_P$ that is known in advance.

As described above, the arithmetic circuit 5 can calculate the distance d by separately reading out the charge quantities $q_1$ and $q_2$. Meanwhile, the above-described pulse is repeatedly emitted, and integrated values thereof can be outputted as each of the charge quantities $q_1$ and $q_2$.

Ratios of the charge quantities $q_1$ and $q_2$ to the total charge quantity corresponds to the above-described phase difference, that is, the distance to the object. The arithmetic circuit 5 calculates the distance to the object based on the phase difference. As described above, when a time difference corresponding to the phase difference is $\Delta t$, the distance d is preferably given by $d=(c\times\Delta t)/2$, but appropriate correction operation may be performed in addition thereto.

For example, if an actual distance is different from the calculated distance d, a coefficient β to correct the latter may be obtained in advance. In this case, in a product after shipment, a value obtained by multiplying the coefficient β to the calculated distance d may be the final calculated distance d.

If the light speed c varies in accordance with an outside air temperature, the outside air temperature may be measured and the light speed c may be corrected based on the outside air temperature. In this case, distance calculation may be performed based on the corrected light speed c. A relationship between a signal inputted to the arithmetic circuit and an actual distance may be stored in advance in a memory. In this case, the distance calculation may be performed by a lookup table method. Depending on a sensor structure, the calculation method may be changed. In this case, a conventionally known calculation method may be used.

Figure 2:
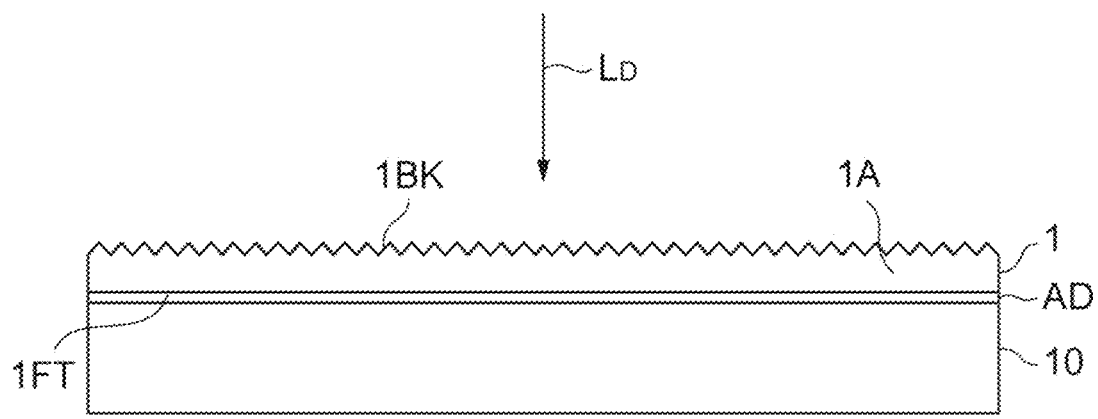
FIG. 2 is a schematic diagram illustrating a cross-sectional configuration of a range image sensor.

FIG. 2 is a schematic diagram illustrating a cross-sectional configuration of the range image sensor.

The range image sensor 1 is a back-illuminated range image sensor and includes a semiconductor substrate 1A. In the present embodiment, the entire semiconductor substrate 1A is thinned. Into the range image sensor 1, the reflected light $L_D$ is incident from a light incident surface 1BK of the semiconductor substrate 1A. The light incident surface 1BK is a back surface of the semiconductor substrate 1A. A front surface 1FT of the range image sensor 1 (semiconductor substrate 1A) is coupled to the wiring substrate 10 via an adhesive region AD. The adhesive region AD is a region including an adhesive element such as a bump electrode. The adhesive region AD includes an electrically insulating adhesive or filler as required.

Figure 3:
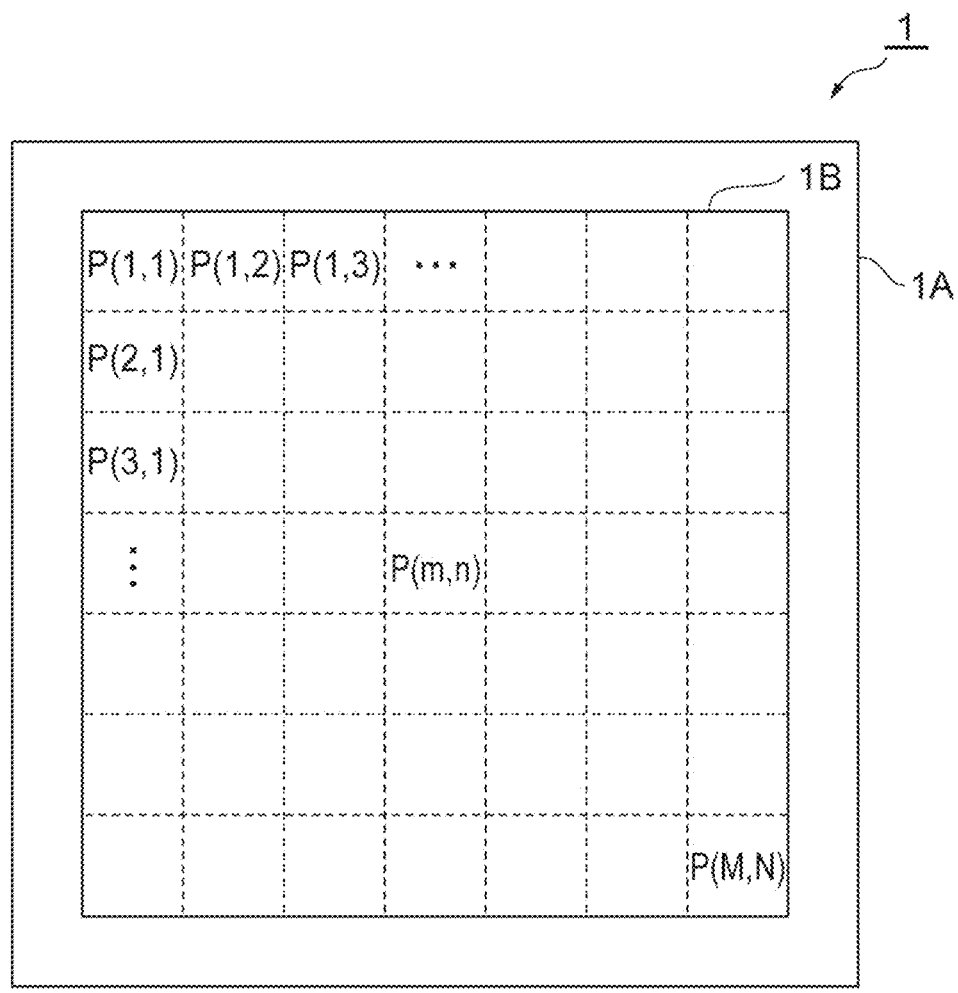
FIG. 3 is a schematic plan view of the range image sensor.

FIG. 3 is a schematic plan view of the range image sensor.

In the range image sensor 1, the semiconductor substrate 1A includes an imaging region 1B. The imaging region 1B includes a plurality of pixels P(m, n) disposed two-dimensionally. Each pixel P(m, n) outputs two charge quantities $(q_1, q_2)$ as the signal d'(m, n) having the above distance information. That is, each pixel P(m, n) outputs the signal d'(m, n) based on the distance to the object. Each pixel P(m, n) functions as a microscopic distance measuring sensor. When reflected light from the object is focused on the imaging region 1B, a range image of the object can be obtained. The range image of the object is an aggregation of distance information up to each point on the object. One pixel P(m, n) functions as one range sensor (unit). The range image sensor 1 includes a plurality of units (a plurality of range sensors).

Figure 4:
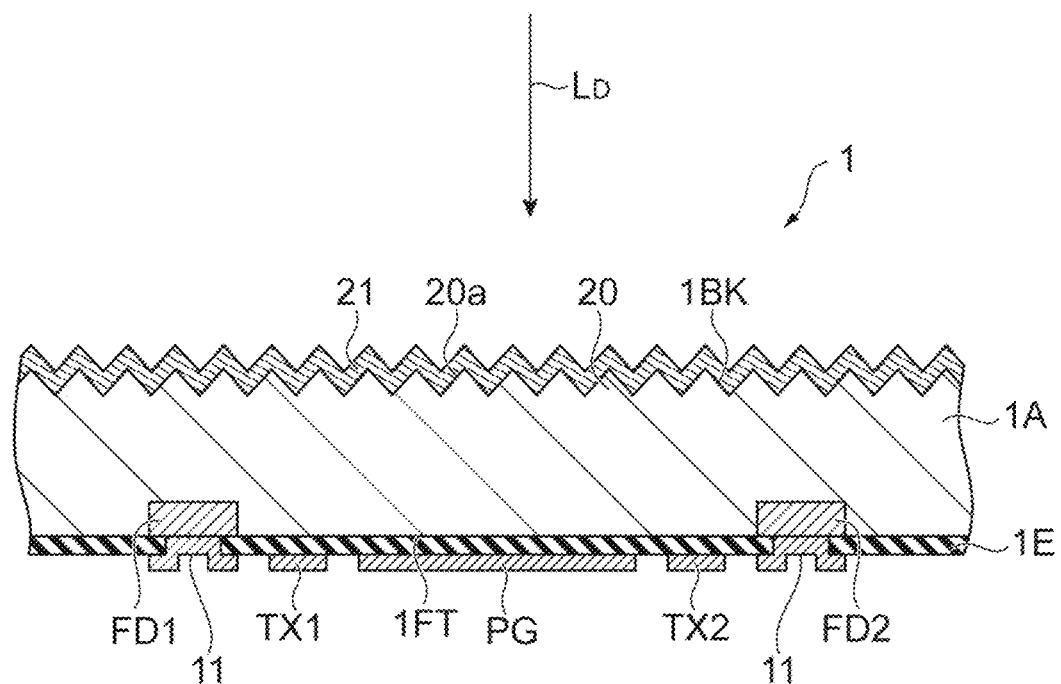
FIG. 4 is a diagram illustrating a cross-sectional configuration of each pixel.

FIG. 4 is a diagram illustrating a cross-sectional configuration of each pixel of the range image sensor.

The range image sensor 1 includes the semiconductor substrate 1A, a photo-gate electrode PG, the first transfer electrode TX1, and the second transfer electrode TX2. The semiconductor substrate 1A includes the light incident surface 1BK (second principal surface) and the front surface 1FT (first principal surface) that oppose each other. The semiconductor substrate 1A includes a silicon substrate.

The photo-gate electrode PG is disposed on the front surface 1FT. The first transfer electrode TX1 and the second transfer electrode TX2 are disposed on the front surface 1FT and adjacent to the photo-gate electrode PG. On the front surface 1FT, an insulation layer 1E is disposed. The front surface 1FT is in contact with the insulation layer 1E. The insulation layer 1E is located between the front surface 1FT, and the photo-gate electrode PG, first transfer electrode TX1, and second transfer electrode TX2. The photo-gate electrode PG, the first transfer electrode TX1, and the second transfer electrode TX2 are in contact with the insulation layer 1E. The photo-gate electrode PG is located between the first transfer electrode TX1 and the second transfer electrode TX2 when viewed from a direction orthogonal to the front surface 1FT.

In the semiconductor substrate 1A, the first semiconductor region FD1 and the second semiconductor region FD2 are provided on the front surface 1FT side. The first semiconductor region FD1 collects a charge flowing into a region immediately below the first transfer electrode TX1. The first semiconductor region FD1 accumulates the charge that has flowed in as a signal charge. The second semiconductor region FD2 collects a charge flowing into a region immediately below the second transfer electrode TX2. The second semiconductor region FD2 accumulates the charge that has flowed in as a signal charge. The first semiconductor region FD1 and the second semiconductor region FD2 function as signal charge collection regions.

The photo-gate electrode PG has, for example, a rectangular shape in plan view. A region corresponding to the photo-gate electrode PG in the semiconductor substrate 1A (a region immediately below the photo-gate electrode PG in the semiconductor substrate 1A) functions as a charge generation region (photosensitive region) that generates a charge in response to the incident light. The photo-gate electrode PG is made of polysilicon, for example. The photo-gate electrode PG may be made of a material other than polysilicon.

The photo-gate electrode PG, the first transfer electrode TX1, and the second transfer electrode TX2 are located between the first semiconductor region FD1 and the second semiconductor region FD2 when viewed from the direction orthogonal to the front surface 1FT. The first transfer electrode TX1 is located between the photo-gate electrode PG and the first semiconductor region FD1 when viewed from the direction orthogonal to the front surface 1FT. The second transfer electrode TX2 is located between the photo-gate electrode PG and the second semiconductor region FD2 when viewed from the direction orthogonal to the front surface 1FT.

The first semiconductor region FD1 and the second semiconductor region FD2 are separated from the photo-gate electrode PG. The first semiconductor region FD1 and the second semiconductor region FD2 oppose each other with the photo-gate electrode PG therebetween. The first semiconductor region FD1 is adjacent to the region immediately below the first transfer electrode TX1 in the semiconductor substrate 1A. The second semiconductor region FD2 is adjacent to the region immediately below the second transfer electrode TX2 in the semiconductor substrate 1A.

Figure 5:
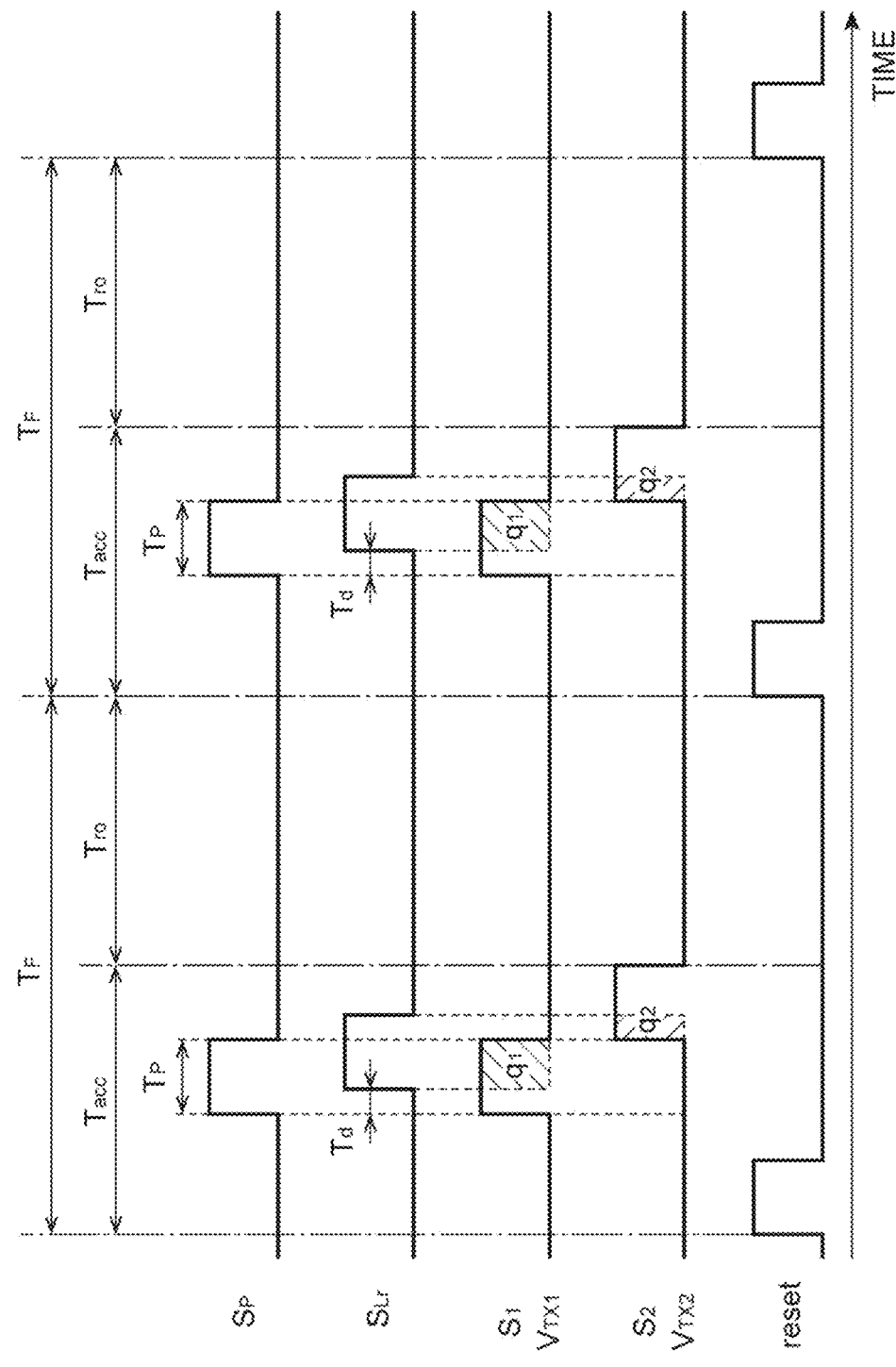
FIG. 5 is a timing chart of various signals.

The first transfer electrode TX1 causes the charge generated in the charge generation region to flow into the first semiconductor region FD1 in response to the first transfer signal $S_1$ (see FIG. 5). The charge flowing into the first semiconductor region FD1 is treated as the signal charge. The second transfer electrode TX2 causes the charge generated in the charge generation region to flow into the second semiconductor region FD2 as the signal charge in response to the second transfer signal $S_2$ (see FIG. 5) having a phase different from that of the first transfer signal $S_1$. The charge flowing into the second semiconductor region FD2 is treated as the signal charge. For example, the first transfer electrode TX1 and the second transfer electrode TX2 have a rectangular shape in plan view. A length of the first transfer electrode TX1 is equal to a length of the second transfer electrode TX2. The first transfer electrode TX1 and the second transfer electrode TX2 are made of, for example, polysilicon. The first transfer electrode TX1 and the second transfer electrode TX2 may be made of a material other than polysilicon. The first transfer electrode TX1 and the second transfer electrode TX2 function as signal charge transfer electrodes.

The semiconductor substrate 1A is, for example, a silicon substrate having a low impurity concentration, and made of a p-type semiconductor. The first semiconductor region FD1 and the second semiconductor region FD2 are regions having a high impurity concentration, and made of an n-type semiconductor. The first semiconductor region FD1 and the second semiconductor region FD2 are floating diffusion regions.

A thickness of the semiconductor substrate 1A is, for example, 3 to 100 µm. An impurity concentration of the semiconductor substrate 1A is, for example, $1 \times 10^{12}$ to $10^{15}$ cm$^{-3}$. A thickness of the first and second semiconductor regions FD1 and FD2 is, for example, 0.1 to 0.5 jam. An impurity concentration of the first and second semiconductor regions FD1 and FD2 is, for example, $1 \times 10^{18}$ to $10^{20}$ cm$^{-3}$.

The insulation layer 1E is provided with contact holes for exposing respective surfaces of the first semiconductor region FD1 and the second semiconductor region FD2. Conductors 11 for electrically connecting the first semiconductor region FD1 and the second semiconductor region FD2 to outside are disposed in the corresponding contact holes. The insulation layer 1E is made of, for example, SiO$_2$.

A phase of the first transfer signal $S_1$ applied to the first transfer electrode TX1 and a phase of the second transfer signal $S_2$ applied to the second transfer electrode TX2 are shifted by 180 degrees. Light incident on the pixel P(m, n) is converted into a charge in the semiconductor substrate 1A. A part of the generated charges migrates, as signal charges, in a direction of the first transfer electrode TX1 or a direction of the second transfer electrode TX2, in accordance with a potential gradient formed by voltages applied to the photo-gate electrode PG and the first and second transfer electrodes TX1 and TX2.

When a high-level signal (e.g., positive electric potential) is supplied to the first transfer electrode TX1, with respect to a negative charge (electron), a potential below the first transfer electrode TX1 becomes lower than a potential of the semiconductor substrate 1A below the photo-gate electrode PG. Therefore, the electron is drawn in the direction of the first transfer electrode TX1 and accumulated in a potential well formed by the first semiconductor region FD1. That is, the charge generated in the semiconductor substrate 1A is collected in the first semiconductor region FD1. An n-type semiconductor contains a positively ionized donor, has a positive potential, and attracts an electron. When an electric potential (e.g., ground electric potential) lower than the positive electric potential described above is supplied to the first transfer electrode TX1, a potential barrier is generated by the first transfer electrode TX1. Therefore, the charge generated in the semiconductor substrate 1A is not drawn into the first semiconductor region FD1 and is not collected in the first semiconductor region FD1.

When a high-level signal (e.g., a positive electric potential) is supplied to the second transfer electrode TX2, with respect to a negative charge (electron), a potential below the second transfer electrode TX2 becomes lower than a potential of the semiconductor substrate 1A below the photo-gate electrode PG. Therefore, the electron is drawn in the direction of the second transfer electrode TX2 and accumulated in a potential well formed by the second semiconductor region FD2. That is, the charge generated in the semiconductor substrate 1A is collected in the second semiconductor region FD2. When an electric potential (e.g., ground electric potential) lower than the positive electric potential described above is supplied to the second transfer electrode TX2, a potential barrier is generated by the second transfer electrode TX2. Therefore, the charge generated in the semiconductor substrate 1A is not drawn into the second semiconductor region FD2 and is not collected in the second semiconductor region FD2.

Next, with reference to FIG. 5, a calculation method of the distance d will be described. FIG. 5 is a timing chart of various signals. FIG. 5 illustrates two frame periods $T_F$ continuous in time series among a plurality of frame periods $T_F$.

FIG. 5 illustrates the drive signal $S_P$ of the light source 3, an intensity signal $S_{Lr}$, the first transfer signal $S_1$ applied to the first transfer electrode TX1, the second transfer signal $S_2$ applied to the second transfer electrode TX2, and a reset signal reset. The intensity signal $S_{Lr}$ is an intensity signal of the reflected light $L_D$ when the reflected light $L_D$ returns to the imaging region 1B. Each of the two frame periods $T_F$ includes a period (accumulation period) $T_{acc}$ for accumulating signal charges and a period (reading period) $T_{ro}$ for reading the signal charges. The drive signal $S_P$, the intensity signal $S_{Lr}$, the first transfer signal $S_1$, and the second transfer signal $S_2$ all are pulse signals having a pulse width $T_P$.

In the accumulation period $T_{acc}$, the reset signal reset is first applied to the first semiconductor region FD1 and the second semiconductor region FD2 prior to distance measurement. Consequently, charges accumulated in the first semiconductor region FD1 and the second semiconductor region FD2 are discharged to outside. In the present embodiment, after the reset signal reset is momentarily turned on and then turned off, the drive signal $S_P$ is applied to the light source 3. In synchronization with the application of the drive signal $S_P$, the first transfer signal $S_1$ and the second transfer signal $S_2$ are applied to the first transfer electrode TX1 and the second transfer electrode TX2 in mutually opposite phases. Application of the first transfer signal $S_1$ and the second transfer signal $S_2$ causes charge transfer. Consequently, signal charges are collected in the first semiconductor region FD1 and the second semiconductor region FD2. Thereafter, in the reading period $T_{ro}$, the signal charges collected in the first semiconductor region FD1 and the second semiconductor region FD2 are read out.

In each frame period $T_F$, the first transfer signal $S_1$ is outputted in synchronization with the drive signal $S_P$ with a phase difference of 0, and the second transfer signal $S_2$ is outputted in synchronization with the drive signal $S_P$ with a phase difference of 180 degrees. Output control of the first transfer signal $S_1$ and the second transfer signal $S_2$ is performed by the control circuit 2. The control circuit 2, in order to synchronize with an emission of the pulsed light $L_P$, for each frame period $T_F$, outputs the first transfer signal $S_1$ to the first transfer electrode TX1 in such a manner as to cause the charge generated in the charge generation region to flow into the first semiconductor region FD1 as the signal charge, and outputs the second transfer signal $S_2$ having the phase different from that of the first transfer signal $S_1$ to the second transfer electrode TX2 in such a manner as to cause the charge generated in the charge generation region to flow into the second semiconductor region FD2 as the signal charge.

The charge quantity $q_{Lr}$ which corresponds to an overlapped portion of the intensity signal $S_{Lr}$ and the first transfer signal $S_1$ outputted in synchronization with the drive signal $S_P$ with a phase difference of 0, is collected in the first semiconductor region FD1. The charge quantity $q_2$, which corresponds to an overlapped portion of the intensity signal $S_{Lr}$ of the reflected light $L_D$ and the second transfer signal $S_2$ outputted in synchronization with the drive signal $S_P$ with a phase difference of 180, is collected in the second semiconductor region FD2.

A phase difference Td between the intensity signal $S_{Lr}$ and the signal outputted in synchronization with the drive signal $S_1$ with the phase difference of 0 is a flight time of light, and the phase difference Td indicates the distance d from the range image sensor 1 to the object. The distance d is calculated by the arithmetic circuit 5 using a ratio of the charge quantity $q_1$ and the charge quantity $q_2$ in one frame period $T_F$ by the following expression (1). Note that c is the light speed.

$$\text{Distance } d = (c/2) \times (T_P \times q_2/(q_1+q_2)) \qquad (1)$$

The arithmetic circuit 5 reads out each of the charge quantities $q_1$ and $q_2$ of the signal charges collected in the first semiconductor region FD1 and the second semiconductor region FD2, for each frame period $T_F$. The arithmetic circuit 5 calculates the distance d to the object based on the read charge quantities $q_1$ and $q_2$.

Again, FIG. 4 is referred. On the light incident surface 1BK of the semiconductor substrate 1A, a plurality of protrusions 20 are formed. In the present embodiment, the plurality of protrusions 20 are formed on the entire imaging region 1B on the light incident surface 1BK. The plurality of protrusions 20 may be formed only in a region corresponding to the charge generation region in the semiconductor substrate 1A. That is, the plurality of protrusions 20 may be formed only in a region corresponding to the photo-gate electrode PG in the semiconductor substrate 1A. Each protrusion 20 has an approximately cone shape and includes a slope 20a inclined with respect to a thickness direction of the semiconductor substrate 1A. The protrusion 20 has, for example, an approximately quadrangular pyramid shape. A height of the protrusion 20 is equal to or more than 200 nm. An interval between apexes of two adjacent protrusions 20 is, for example, 500 to 3000 nm.

In the protrusion 20, the (111) plane of the semiconductor substrate 1A is exposed as the slope 20a. The slope 20a is optically exposed. The slope 20a being optically exposed means not only a case where the slope 20a is in contact with atmospheric gas such as air but also a case where an optically transparent film is formed on the slope 20a.

The range image sensor 1 includes an anti-reflection film 21. The anti-reflection film 21 is disposed on the light incident surface 1BK of the semiconductor substrate 1A. In the present embodiment, the anti-reflection film 21 includes a silicon oxide ($SiO_2$) film. That is, the anti-reflection film 21 is an oxide film that transmits incident light. The anti-reflection film 21 is in contact with the slope 20a in such a manner as to cover the slope 20a of the protrusion 20. On a surface of the anti-reflection film 21, an asperity corresponding to the plurality of protrusions 20 is formed. A thickness of the anti-reflection film 21 is, for example, 1 to 200 nm.

Figure 6:
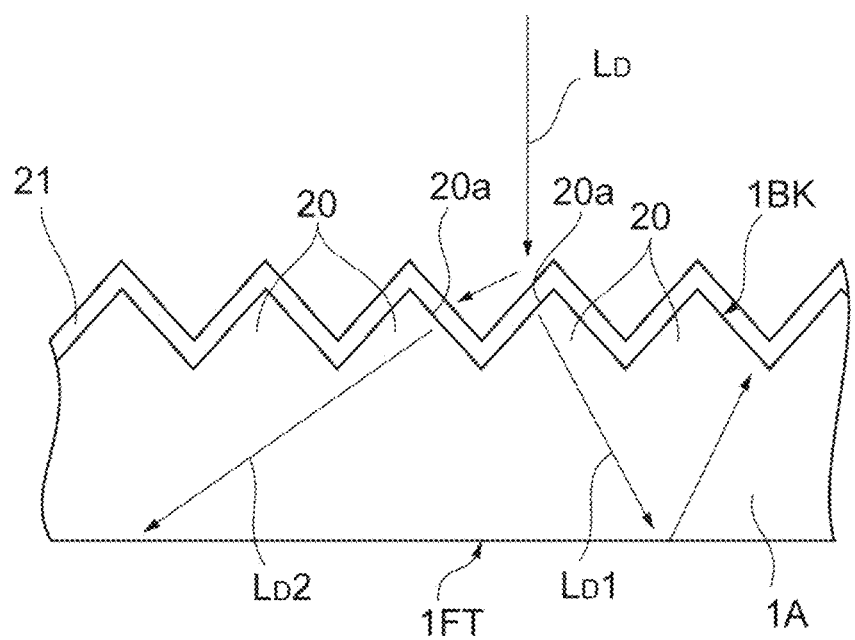
FIG. 6 is a schematic diagram illustrating traveling of light in the range image sensor.

As described above, in the present embodiment, the plurality of protrusions 20 formed on the light incident surface 1BK includes the slope 20a. When the reflected light $L_D$ is incident on the semiconductor substrate 1A from the light incident surface 1BK, as illustrated in FIG. 6, a part of the light is reflected on the light incident surface 1BK side. Since the slope 20a is inclined with respect to the thickness direction of the semiconductor substrate 1A, for example, light reflected on a slope 20a side of one protrusion 20 is directed to a slope 20a side of the protrusion 20 adjacent to the one protrusion 20, and incident on the semiconductor substrate 1A from the slope 20a of the adjacent protrusion 20. That is, the light reflected on the light incident surface 1BK (slope 20a) side is re-incident on the semiconductor substrate 1A.

At the protrusion 20, the (111) plane of the semiconductor substrate 1A is exposed as the slope 20a. Therefore, the light incident on the semiconductor substrate 1A from the slope 20a tends to be taken into the semiconductor substrate 1A. Since the height of the protrusion 20 is equal to or more than 200 nm, a surface area of the slope 20a is large. Therefore, a large amount of light incident on the slope 20a is taken into the semiconductor substrate 1A.

Light in an ultraviolet wavelength region has a large absorption coefficient by silicon. Therefore, the light in an ultraviolet wavelength region is absorbed in a region close to the light incident surface 1BK (slope 20a) of the semiconductor substrate 1A. In the range image sensor 1, the (111) plane of the semiconductor substrate 1A is exposed at the protrusion 20 formed on the semiconductor substrate 1A. Therefore, absorption of light in a region close to the light incident surface 1BK is not hindered.

Consequently, the range image sensor 1 enhances spectral response in the ultraviolet wavelength band. For the reasons described below, the range image sensor 1 also enhances spectral response in a near-infrared wavelength band.

As illustrated also in FIG. 6, light $L_D1$ incident on the semiconductor substrate 1A from the slope 20a travels in a direction crossing the thickness direction of the semiconductor substrate 1A, and may reach the front surface 1FT. The light $L_D1$ reaching the front surface 1FT is totally reflected by the front surface 1FT depending on an angle of reaching the front surface 1FT. This increases a traveling distance of the light incident on the range image sensor 1 (semiconductor substrate 1A).

Light $L_D2$ re-incident on the semiconductor substrate 1A travels through the semiconductor substrate 1A in a direction crossing the thickness direction of the semiconductor substrate 1A. Therefore, a traveling distance of the light $L_D2$ re-incident on the range image sensor 1 (semiconductor substrate 1A) also increases.

As the traveling distance of the light traveling in the semiconductor substrate 1A increases, a distance in which light is absorbed also increases. Therefore, even the light in the near-infrared wavelength band having a small absorption coefficient by silicon is absorbed by the semiconductor substrate 1A. Consequently, the range image sensor 1 enhances the spectral response in the near-infrared wavelength band.

When the range image sensor 1 is used outdoors, the range image sensor 1 may be affected by ambient light. When the range image sensor 1 is affected by the ambient light, accuracy of the distance detected by the range image sensor 1 deteriorates. The ambient light includes, for example, sunlight.

An irradiation intensity of sunlight sharply decreases in a wavelength band of about 400 nm or less. Therefore, by using a light source that emits light having a wavelength band of about 400 nm or less as the light source 3, deterioration of the accuracy of the distance detected by the range image sensor 1 can be suppressed. As described above, the range image sensor 1 enhances the spectral response in the ultraviolet wavelength band. Therefore, even in a case in which the light source 3 is a light source that emits light in a wavelength band of about 400 nm or less, the range image sensor 1 appropriately detects the reflected light $L_D$.

The irradiation intensity of sunlight is lowered not only in the wavelength band of about 400 nm or less but also in a wavelength band around about 940 nm. Therefore, also by using a light source that emits light in the wavelength band around about 940 nm as the light source 3, deterioration of the accuracy of the distance detected by the range image sensor 1 can be suppressed. In the range image sensor 1, as described above, the spectral response in a near-infrared wavelength band is also improved. Therefore, even in a case in which the light source 3 is a light source that emits light in the wavelength band around about 940 nm, the range image sensor 1 appropriately detects the reflected light $L_D$.

The range image sensor 1 includes the anti-reflection film 21 that includes a silicon oxide film. Therefore, light tends to be further taken in by the semiconductor substrate 1A. Consequently, the range image sensor 1 further enhances the spectral response in the ultraviolet and near-infrared wavelength bands.

The present inventors conducted experiments to confirm the enhancement effects of the spectral responses according to the present embodiment.

By producing a range image sensor 1 (referred to as Examples 1 and 2) having the above-described configuration, and a range image sensor 1 (referred to as Comparative Example 1) in which protrusions are not formed on a light incident surface of a semiconductor substrate, spectral response of each of the range image sensors 1 was examined. Examples 1 and 2 and Comparative Example 1 have the same configuration except for the formation of protrusions. A size of the charge generation region is set to 0.5 mmφ.

Figure 7:
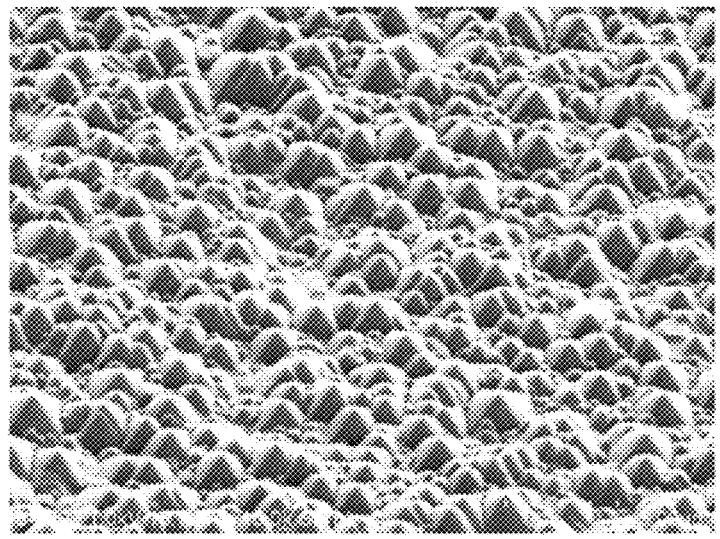
FIG. 7 is an SEM image obtained by observation of a range image sensor according to Example 1.
Figure 7:
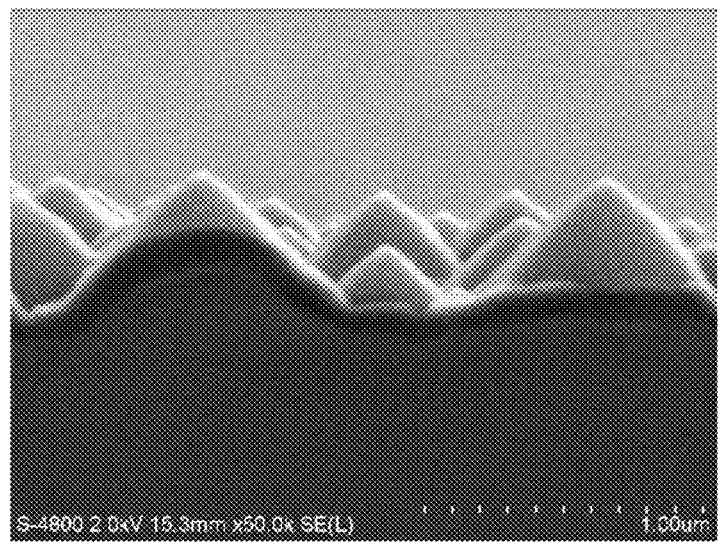
Figure 8:
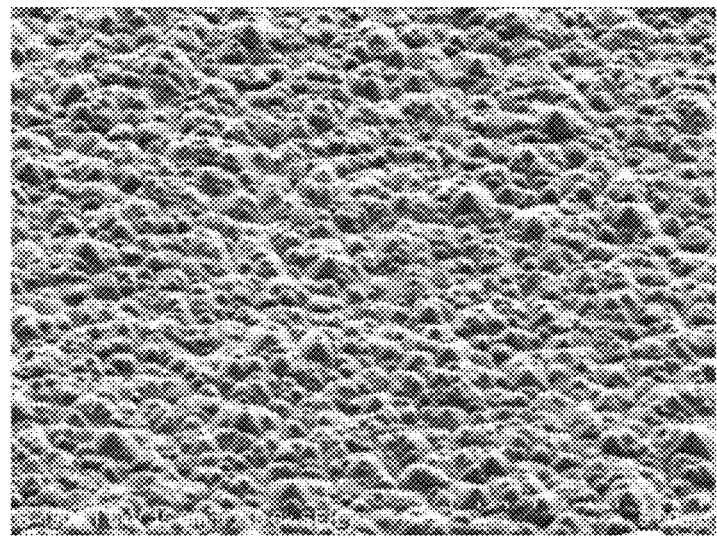
FIG. 8 is an SEM image obtained by observation of a range image sensor according to Example 2.
Figure 8:
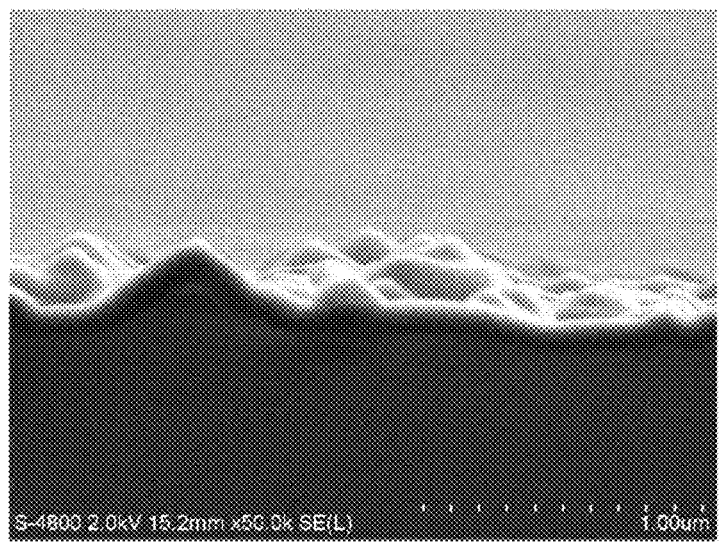

In Example 1 (see FIG. 7), the height of the protrusion 20 is 1570 nm (including the thickness of the anti-reflection film 21). In Example 2 (see FIG. 8), the height of the protrusion 20 is 1180 nm (including the thickness of the anti-reflection film 21). FIGS. 7(a) and 8(a) are SEM images of a surface on the light incident surface side of the range image sensor (the surface of the anti-reflection film 21) when observed obliquely at 45°. FIGS. 7(b) and 8(b) are SEM images of an end surface of the range image sensor when observed.

Figure 9:
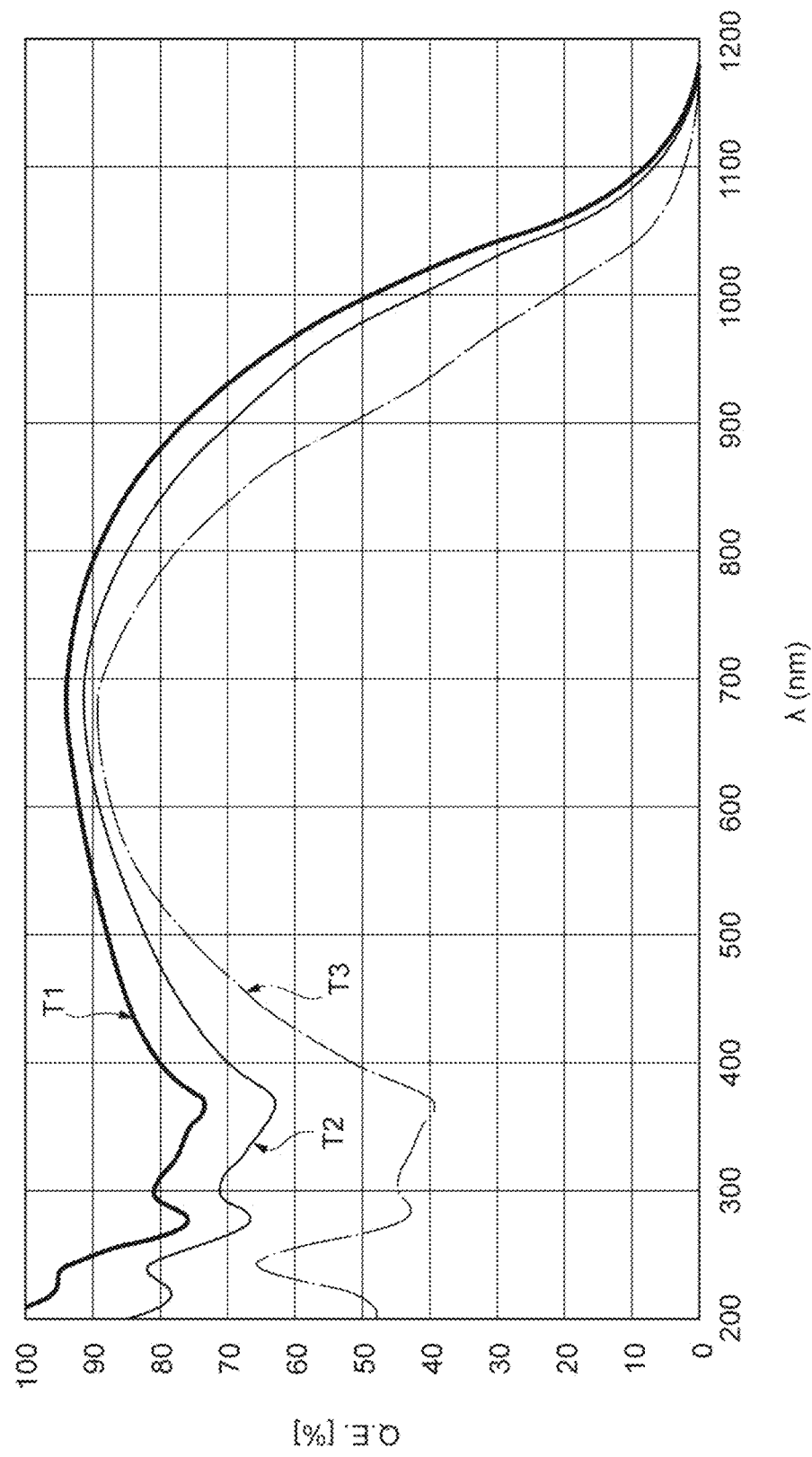
FIG. 9 is a graph illustrating changes in quantum efficiency with respect to wavelengths in Examples 1 and 2 and Comparative Example 1.
Figure 10:
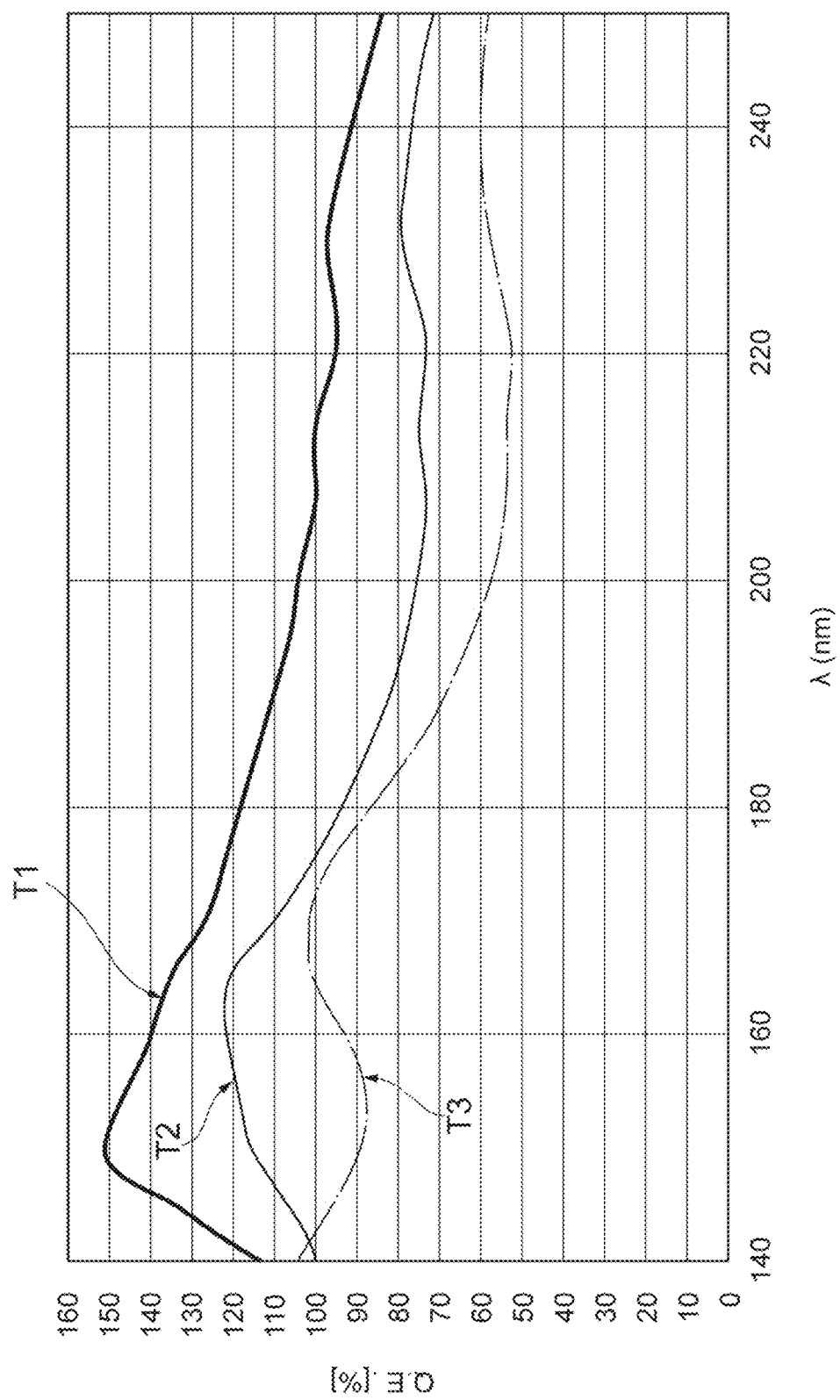
FIG. 10 is a graph illustrating changes in quantum efficiency with respect to wavelengths in Examples 1 and 2 and Comparative Example 1.

Results are illustrated in FIGS. 9 and 10. In FIGS. 9 and 10, the spectral response of Example 1 is indicated by T1, the spectral response of Example 2 is indicated by T2, and the spectral response of Comparative Example 1 is indicated by T3. In FIG. 9, a vertical axis represents quantum efficiency (QE) and a horizontal axis represents a wavelength of light (nm). FIG. 10 illustrates the spectral response in a vacuum ultraviolet wavelength band.

As seen from FIGS. 9 and 10, in Examples 1 and 2, the spectral response in the ultraviolet wavelength band is greatly enhanced as compared with Comparative Example 1. Needless to say, in Examples 1 and 2, the spectral response in the near-infrared wavelength band is also enhanced as compared with Comparative Example 1. In Example 1, the spectral response in the ultraviolet and near-infrared wavelength bands are enhanced as compared with Example 2.

Next, with reference to FIGS. 11 to 22, configurations of modifications of this embodiment will be described.

Figure 11:
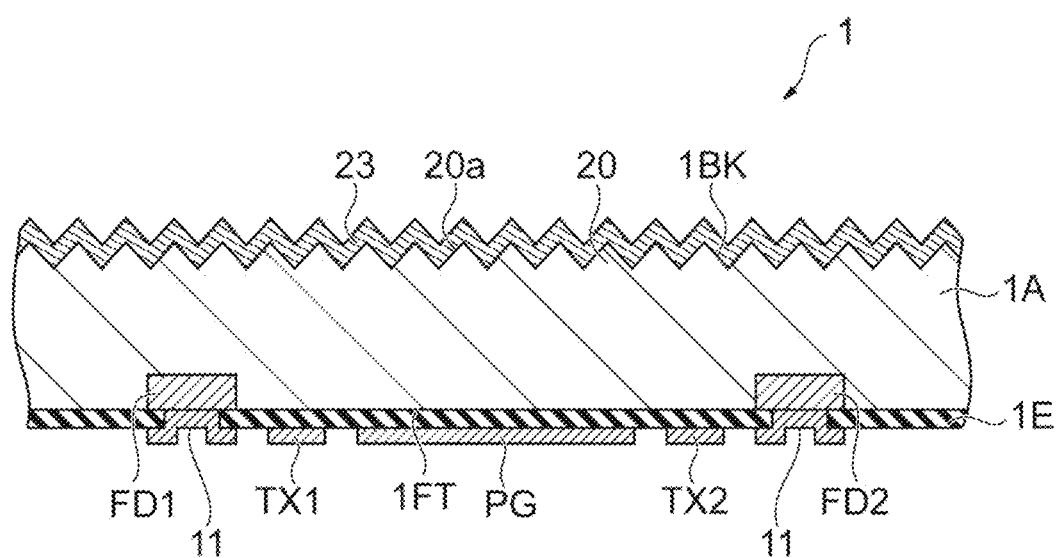
FIG. 11 is a diagram illustrating a cross-sectional configuration of each pixel of a range image sensor according to a modification.

In the modification illustrated in FIG. 11, the range image sensor 1 is provided with an aluminum oxide ($Al_2O_3$) film 23 instead of the anti-reflection film 21. FIG. 11 is a diagram illustrating a cross-sectional configuration of each pixel of the range image sensor according to the modification.

The aluminum oxide film 23 is disposed on the light incident surface 1BK. The aluminum oxide film 23 is an oxide film that transmits incident light. A thickness of the aluminum oxide film 23 is, for example, 0.0003 to 3 μm. On a surface of the aluminum oxide film 23, an asperity corresponding to the plurality of protrusions 20 is formed.

The aluminum oxide film 23 is charged to negative polarity. Since the conductivity type of the semiconductor substrate 1A is p-type, a predetermined fixed charge (a fixed charge of positive polarity) exists on the light incident surface 1BK side of the semiconductor substrate 1A by the aluminum oxide film 23. A region on the light incident surface 1BK side of the semiconductor substrate 1A where the fixed charge of positive polarity exists functions as an accumulation layer. Therefore, the slope 20a of the protrusion 20 is included in a surface of the accumulation layer.

Since the accumulation layer recombines unnecessary charges generated irrespective of light on the light incident surface 1BK, a dark current is reduced. The accumulation layer suppresses trapping, on the light incident surface 1BK, of charges generated by light near the light incident surface 1BK of the semiconductor substrate 1A. Therefore, charges generated by light efficiently migrate to the front surface 1FT side of the semiconductor substrate 1A. Consequently, in the range image sensor 1 according to the present modification, the photodetection sensitivity is enhanced.

Between the aluminum oxide film 23 and the light incident surface 1BK, a silicon oxide film may be disposed. That is, the aluminum oxide film 23 does not need to be in direct contact with the light incident surface 1BK. Even in this case, due to the aluminum oxide film 23, the fixed charge of positive polarity exists on the light incident surface 1BK side of the semiconductor substrate 1A.

Figure 12:
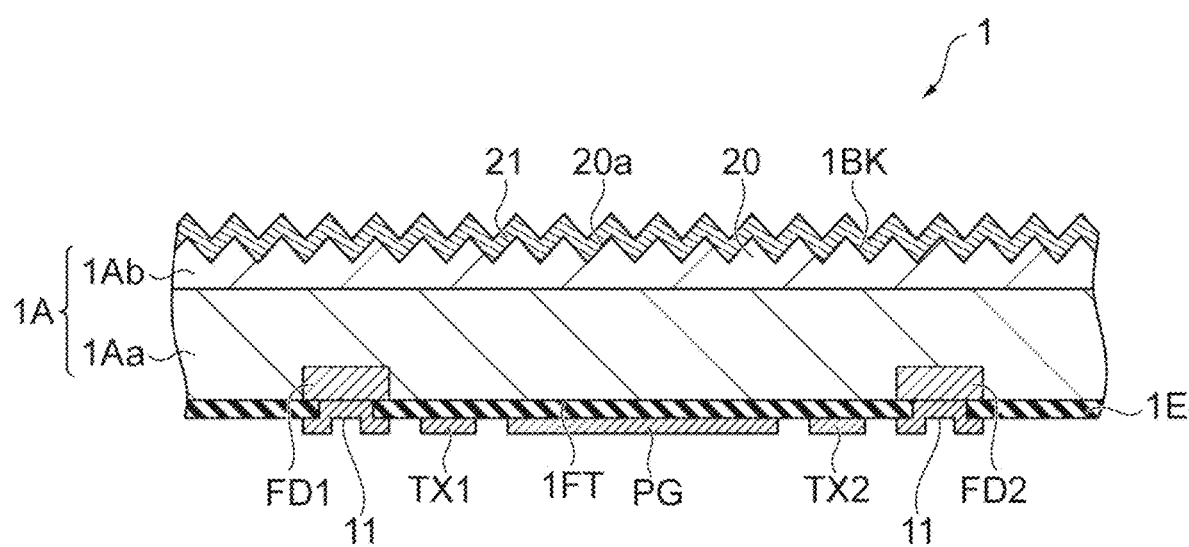
FIG. 12 is a diagram illustrating a cross-sectional configuration of each pixel of a range image sensor according to a modification.

In the modification illustrated in FIG. 12, the semiconductor substrate 1A includes a first substrate region 1Aa and a second substrate region 1Ab. FIG. 12 is a diagram illustrating a cross-sectional configuration of each pixel of a range image sensor according to the modification.

The first substrate region 1Aa is provided on a front surface 1FT side of the semiconductor substrate 1A. The first substrate region 1Aa includes the front surface 1FT. The second substrate region 1Ab is provided on a light incident surface 1BK side of the semiconductor substrate 1A. The second substrate region 1Ab includes the light incident surface 1BK. The first substrate region 1Aa and the second substrate region 1Ab are made of a p-type semiconductor. An impurity concentration of the second substrate region 1Ab is higher than an impurity concentration of the first substrate region 1Aa. The semiconductor substrate 1A can be obtained by, for example, growing, on a p-type semiconductor substrate, a p⁻-type epitaxial layer having a lower impurity concentration than the semiconductor substrate.

In the present modification, the first semiconductor region FD1 and the second semiconductor region FD2 are provided in the first substrate region 1Aa. The insulation layer 1E is disposed on a surface (front surface 1FT) of the first substrate region 1Aa.

On the light incident surface 1BK included in the second substrate region 1Ab, the plurality of protrusions 20 are formed. That is, the slope 20a of the protrusion 20 is included in a surface (light incident surface 1BK) of the second substrate region 1Ab. In the protrusion 20, a (111) plane of the second substrate region 1Ab is exposed as the slope 20a. The anti reflection film 21 is disposed on the surface (light incident surface 1BK) of the second substrate region 1Ab.

In the present modification, the second substrate region 1Ab functions as an accumulation layer. Therefore, as described above, in the range image sensor 1 according to the present modification, the photodetection sensitivity is enhanced. The range image sensor 1 according to the modification illustrated in FIG. 12 may also be provided with the aluminum oxide film 23 instead of the anti-reflection film 21.

Figure 13:
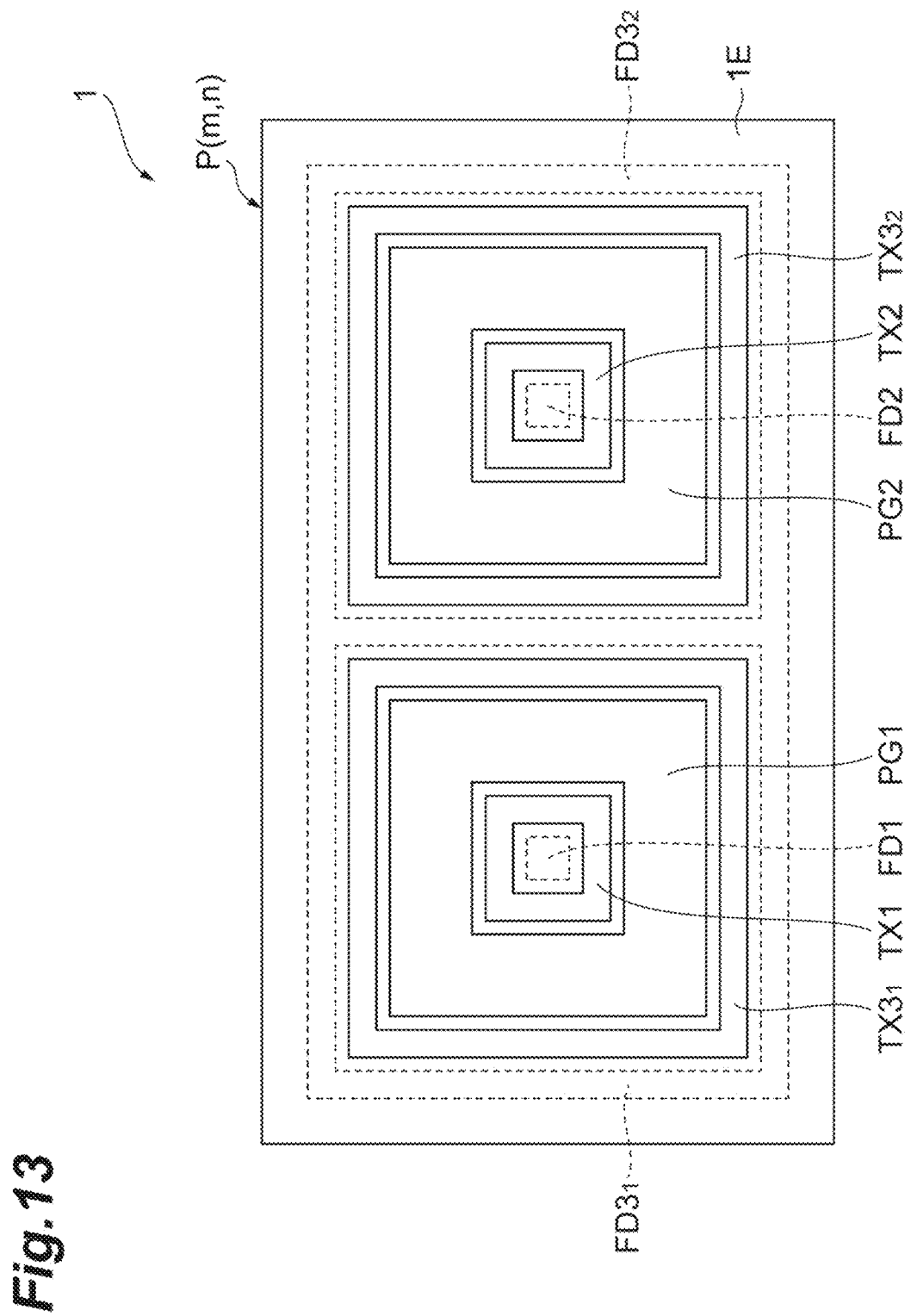
FIG. 13 is a schematic diagram illustrating a configuration of a pixel of a range image sensor according to a modification.
Figure 14:
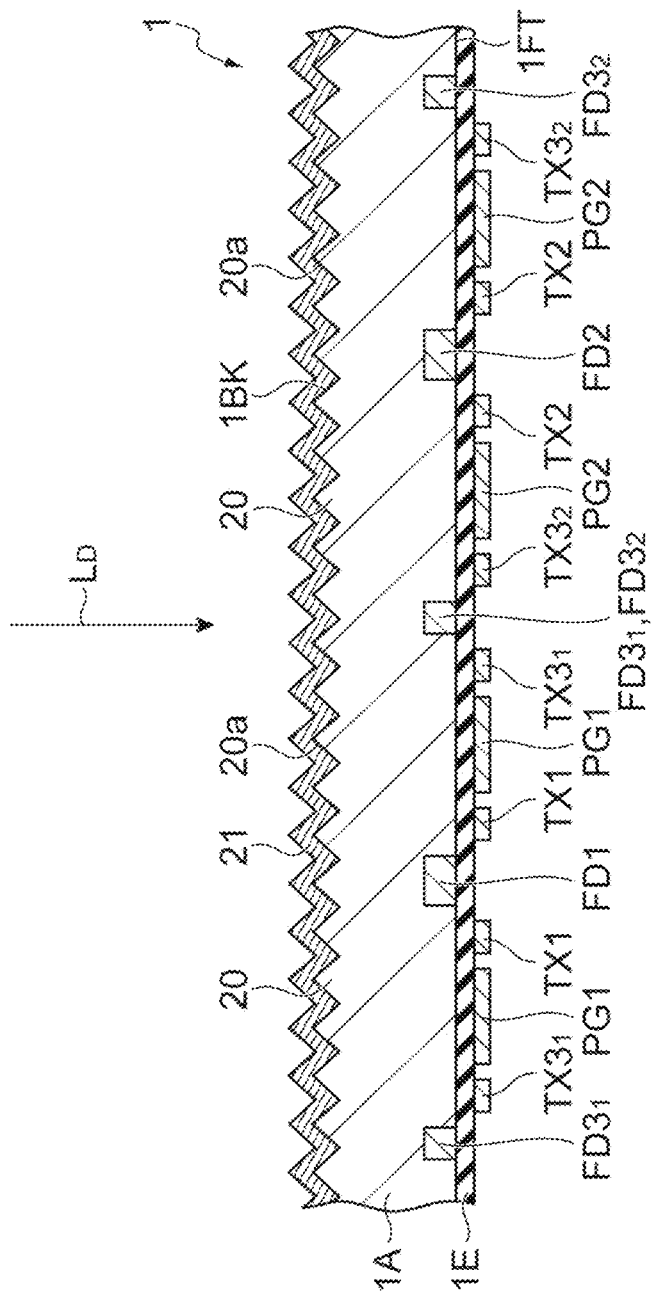
FIG. 14 is a diagram illustrating a cross-sectional configuration of each pixel.

In the modification illustrated in FIGS. 13 and 14, the range image sensor 1 includes, in each pixel P(m, n), a plurality of photo-gate electrodes (two photo-gate electrodes in the present modification) PG1 and PG2, a first transfer electrode TX1 and a second transfer electrode TX2, a plurality of third transfer electrodes (two third transfer electrodes in the present modification) TX3₁ and TX3₂, a first semiconductor region FD1 and a second semiconductor region FD2, and a plurality of third semiconductor regions (two third semiconductor regions in the present modification) FD3₁ and FD3₂. FIG. 13 is a schematic diagram illustrating a configuration of a pixel of the range image sensor according to the modification. FIG. 14 is a diagram illustrating a cross-sectional configuration of each pixel.

The two photo-gate electrodes PG1 and PG2 are disposed on a front surface 1FT, and are separated from each other. The first transfer electrode TX1 and the third transfer electrode TX3₁ are disposed on the front surface 1FT, and are adjacent to the photo-gate electrode PG1. The second transfer electrode TX2 and the third transfer electrode TX3₂ are disposed on the front surface 1FT, and are adjacent to the photo-gate electrode PG2. On the front surface 1FT, an insulation layer 1E is disposed. The insulation layer 1E is located between the front surface 1FT, and the photo-gate electrodes PG1 and PG2 and first to third transfer electrodes TX1, TX2, TX3₁, and TX3₂. The photo-gate electrodes PG1 and PG2 and first to third transfer electrodes TX1, TX2, TX3₁, and TX3₂ are in contact with the insulation layer 1E. The first semiconductor region FD1 collects a charge flowing into a region immediately below the first transfer electrode TX1. The first semiconductor region FD1 accumulates the charge that has flowed in. The second semiconductor region FD2 collects a charge flowing into a region immediately below the second transfer electrode TX2. The second semiconductor region FD2 accumulates the charge that has flowed in. The third semiconductor region FD3₁ collects a charge flowing into a region immediately below the third transfer electrode TX3₁. The third semiconductor region FD3₂ collects a charge flowing into a region immediately below the third transfer electrode TX3₂.

The photo-gate electrodes PG1 and PG2 have an approximately ring shape in plan view. In the present modification, the photo-gate electrodes PG1 and PG2 have an approximately polygonal ring shape (e.g., a rectangular ring shape). The photo-gate electrodes PG1 and PG2 may have a circular ring shape. In the present modification, the photo-gate electrodes PG1 and PG2 are made of, for example, polysilicon. The photo-gate electrodes PG1 and PG2 may be made of a material other than polysilicon.

The first semiconductor region FD1 is disposed inside the photo-gate electrode PG1 in such a manner as to be surrounded by the photo-gate electrode PG1. The first semiconductor region FD1 is separated from a region immediately below the photo-gate electrode PG1. The first semiconductor region FD1 is located inside a light receiving region in such a manner as to be surrounded by the light receiving region, and is separated from a charge generation region.

The second semiconductor region FD2 is disposed inside the photo-gate electrode PG2 in such a manner as to be surrounded by the photo-gate electrode PG2. The second semiconductor region FD2 is separated from a region immediately below the photo-gate electrode PG2. The second semiconductor region FD2 is located inside a light receiving region in such a manner as to be surrounded by the light receiving region, and is separated from a charge generation region.

The first semiconductor region FD1 and the second semiconductor region FD2 have an approximately polygonal shape in plan view. In the present modification, the first semiconductor region FD1 and the second semiconductor region FD2 have a rectangular shape (e.g., a square shape).

The first transfer electrode TX1 is disposed between the photo-gate electrode PG1 and the first semiconductor region FD1. The first transfer electrode TX1 is located outside the first semiconductor region FD1 in such a manner as to surround the first semiconductor region FD1, and is located inside the photo-gate electrode PG1 in such a manner as to be surrounded by the photo-gate electrode PG1. The first transfer electrode TX1 is located between the photo-gate electrode PG1 and the first semiconductor region FD1, and is separated from the photo-gate electrode PG1 and the first semiconductor region FD1.

The second transfer electrode TX2 is disposed between the photo-gate electrode PG2 and the second semiconductor region FD2. The second transfer electrode TX2 is located outside the second semiconductor region FD2 in such a manner as to surround the second semiconductor region FD2, and is located inside the photo-gate electrode PG2 in such a manner as to be surrounded by the photo-gate electrode PG2. The second transfer electrode TX2 is located between the photo-gate electrode PG2 and the second semiconductor region FD2, and is separated from the photo-gate electrode PG2 and the second semiconductor region FD2.

The first transfer electrode TX1 and the second transfer electrode TX2 have an approximately polygonal ring shape in plan view. In the present modification, the first transfer electrode TX1 and the second transfer electrode TX2 have a rectangular ring shape.

The third semiconductor region $FD3_1$ is disposed outside the photo-gate electrode PG1 in such a manner as to surround the photo-gate electrode PG1. The third semiconductor region $FD3_1$ is separated from the region immediately below the photo-gate electrode PG1. The third semiconductor region $FD3_1$ is located outside the light receiving region in such a manner as to surround the light receiving region, and is separated from the charge generation region.

The third semiconductor region $FD3_2$ is disposed outside the photo-gate electrode PG2 in such a manner as to surround the photo-gate electrode PG2. The third semiconductor region $FD3_2$ is separated from the region immediately below the photo-gate electrode PG2. The third semiconductor region $FD3_2$ is located outside the light receiving region in such a manner as to surround the light receiving region, and is separated from the charge generation region.

The third semiconductor regions $FD3_1$ and $FD3_2$ have an approximately polygonal ring shape in plan view. In the present modification, the third semiconductor regions $FD3_1$ and $FD3_2$ have a rectangular ring shape. In addition, in the present modification, the adjacent third semiconductor regions $FD3_1$ and $FD3_2$ are integrally formed. That is, a region between the third transfer electrode $TX3_1$ and the third transfer electrode $TX3_2$ is shared between the third semiconductor region $FD3_1$ and the third semiconductor region $FD3_2$. The third semiconductor regions $FD3_1$ and $FD3_2$ function as unnecessary-charge collection regions. The third semiconductor regions $FD3_1$ and $FD3_2$ are regions having a high impurity concentration and made of an n-type semiconductor. The third semiconductor regions $FD3_1$ and $FD3_2$ are floating diffusion regions.

The third transfer electrode $TX3_1$ is disposed between the photo-gate electrode PG1 and the third semiconductor region $FD3_1$. The third transfer electrode $TX3_1$ is located outside the photo-gate electrode PG1 in such a manner as to surround the photo-gate electrode PG1, and is located inside the third semiconductor region $FD3_1$ in such a manner as to be surrounded by the third semiconductor region $FD3_1$. The third transfer electrode $TX3_1$ is located between the photo-gate electrode PG1 and the third semiconductor region $FD3_1$, and is separated from the photo-gate electrode PG1 and the third semiconductor region $FD3_1$.

The third transfer electrode $TX3_2$ is disposed between the photo-gate electrode PG2 and the third semiconductor region $FD3_2$. The third transfer electrode $TX3_2$ is located outside the photo-gate electrode PG2 in such a manner as to surround the photo-gate electrode PG2, and is located inside the third semiconductor region $FD3_2$ in such a manner as to be surrounded by the third semiconductor region $FD3_2$. The third transfer electrode $TX3_2$ is located between the photo-gate electrode PG2 and the third semiconductor region $FD3_2$, and is separated from the photo-gate electrode PG2 and the third semiconductor region $FD3_2$.

The third transfer electrodes $TX3_1$ and $TX3_2$ have an approximately polygonal ring shape in plan view. In the present modification, the third transfer electrodes $TX3_1$ and $TX3_2$ have a rectangular ring shape. The third transfer electrodes $TX3_1$ and $TX3_2$ are made of, for example, polysilicon. The third transfer electrodes $TX3_1$ and $TX3_2$ may be made of a material other than polysilicon. The third transfer electrodes $TX3_1$ and $TX3_2$ function as unnecessary-charge transfer electrodes.

The photo-gate electrode PG1, the first transfer electrode TX1, and the third transfer electrode $TX3_1$ are disposed concentrically from the first semiconductor region FD1 side in the order of the first transfer electrode TX1, the photo-gate electrode PG1, and the third transfer electrode $TX3_1$, with the first semiconductor region FD1 as a center. The photo-gate electrode PG2, the second transfer electrode TX2, and the third transfer electrode $TX3_2$ are disposed concentrically from the second semiconductor region FD2 side in the order of the second transfer electrode TX2, the photo-gate electrode PG2, and the third transfer electrode $TX3_2$, with the second semiconductor region FD2 as a center.

The insulation layer 1E is provided with contact holes (not illustrated) for exposing surfaces of the first to third semiconductor regions FD1, FD2, $FD3_1$, and $FD3_2$. Conductors (not illustrated) for electrically connecting the first to third semiconductor regions FD1, FD2, $FD3_1$, and $FD3_2$ to outside are disposed in the contact holes.

Regions corresponding to the photo-gate electrodes PG1 and PG2 in a semiconductor substrate 1A (the regions immediately below the photo-gate electrode PG1 and PG2 in the semiconductor substrate 1A) function as the charge generation regions that generate the charge in response to the incident light. Therefore, the charge generation regions have a rectangular ring shape corresponding to the shapes of the photo-gate electrodes PG1 and PG2. In the present modification, a first unit including the photo-gate electrode PG1 (the charge generation region immediately below the photo-gate electrode PG1) and a second unit including the photo-gate electrode PG2 (the charge generation region immediately below the photo-gate electrode PG2) are disposed adjacent to each other. The first unit and the second unit adjacently disposed constitute one pixel P(m, n).

When a high-level signal (e.g., a positive electric potential) is supplied to the third transfer electrodes $TX3_1$ and $TX3_2$, with respect to a negative charge (electron), potentials of the regions immediately below the third transfer electrodes $TX3_1$ and $TX3_2$ become lower than potentials of the regions immediately below the photo-gate electrodes PG1 and PG2 in the semiconductor substrate 1A. Negative charges (electrons) are drawn in directions of the third transfer electrodes $TX3_1$ and $TX3_2$ and flow into potential wells framed by the third semiconductor regions $FD3_1$ and $FD3_2$. When a low-level signal (e.g., ground electric potential) is applied to the third transfer electrodes $TX3_1$ and $TX3_2$, with respect to a negative charge (electron), potential barriers are generated by the third transfer electrodes $TX3_1$ and $TX3_2$. Therefore, the charges generated in the semiconductor substrate 1A are not drawn into the third semiconductor regions $FD3_1$ and $FD3_2$. The third semiconductor regions $FD3_1$ and $FD3_2$ collect and discharge a part of the charges generated in the charge generation region in response to the incidence of light, as unnecessary charges.

Figure 15:
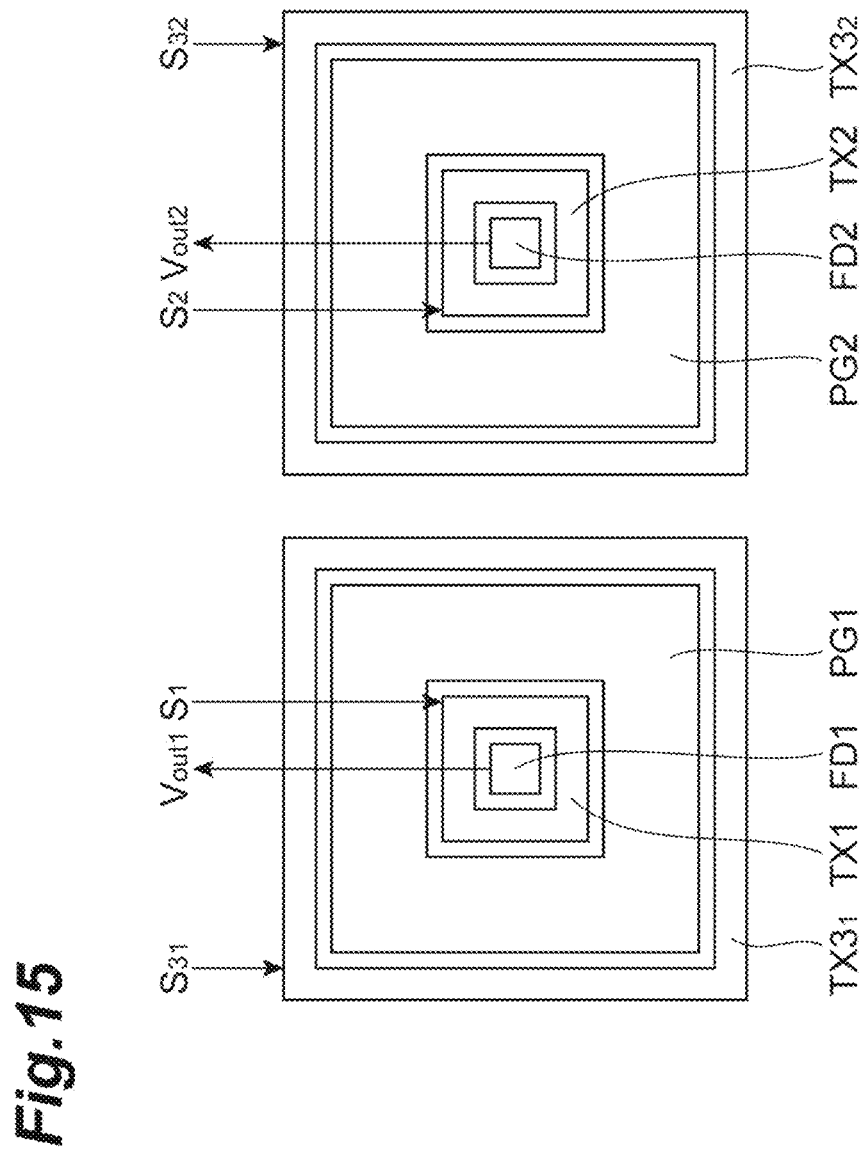
FIG. 15 is a schematic diagram illustrating a configuration of each pixel.

FIG. 15 is a schematic diagram illustrating a configuration of each pixel.

A first transfer signal $S_1$ is supplied to the first transfer electrode TX1. A second transfer signal $S_2$ is supplied to the second transfer electrode TX2. Third transfer signals $S_{31}$ and $S_{32}$ are supplied to the third transfer electrodes $TX3_1$ and $TX3_2$.

A charge generated in the charge generation region (the region immediately below the photo-gate electrode PG1) flow as a signal charge into a potential well formed by the first semiconductor region FD1 when a high-level first transfer signal $S_1$ is supplied to the first transfer electrode TX1. The signal charges accumulated in the first semiconductor region FD1 are read from the first semiconductor region FD1 as an output ($V_{out1}$) corresponding to a charge quantity $q_1$.

A charge generated in the charge generation region (the region immediately below the photo-gate electrode PG2) flow as a signal charge into a potential well formed by the second semiconductor region FD2 when a high-level second transfer signal $S_2$ is supplied to the second transfer electrode TX2. The signal charges accumulated in the second semiconductor region FD2 are read from the second semiconductor region FD2 as an output ($V_{out2}$) corresponding to a charge quantity $q_2$.

These outputs ($V_{out1}$, $V_{out2}$) correspond to the above-mentioned signal d'(m, n).

Figure 16:
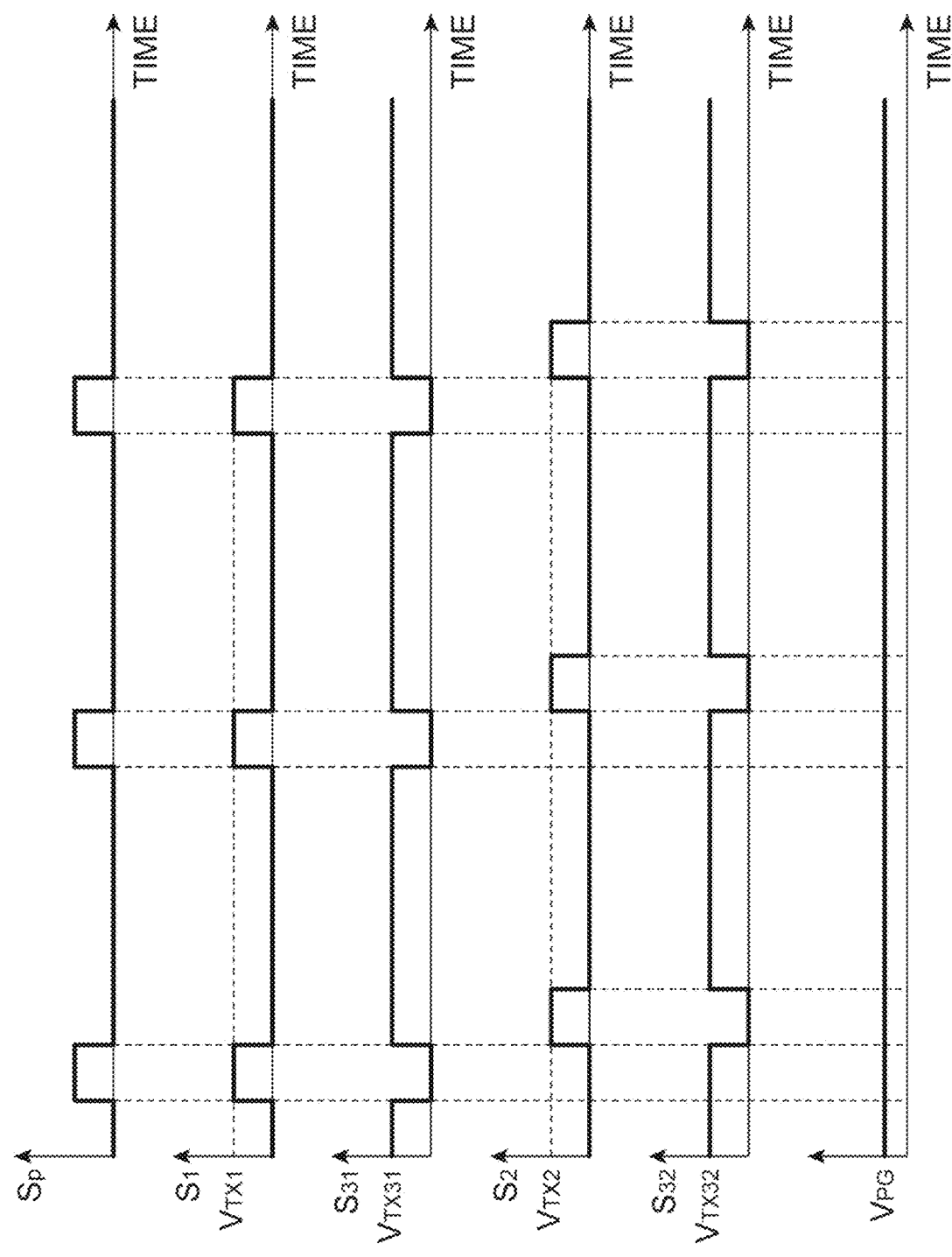
FIG. 16 is a timing chart of various signals.

FIG. 16 is a timing chart of various signals.

A period of one frame consists of a period (accumulation period) for accumulating signal charges and a period (reading period) for reading signal charges. Focusing on one pixel, in the accumulation period, a signal based on the drive signal $S_P$ is applied to the light source, and in synchronization therewith, the first transfer signal $S_1$ is applied to the first transfer electrode TX1. Then, the second transfer signal $S_2$ is applied to the second transfer electrode TX2 with a predetermined phase difference from the first transfer signal $S_1$ (e.g., a phase difference of 180 degrees). Prior to distance measurement, a reset signal is applied to the first and second semiconductor regions FD1 and FD2. Consequently, charges accumulated in the first semiconductor region FD1 and the second semiconductor region FD2 are discharged to outside. After the reset signal is momentarily turned on and then turned off, the first and second transfer signals $S_1$ and $S_2$ are sequentially applied to the first and second transfer electrodes TX1 and TX2. Charge transfer is sequentially performed in synchronization with the application of the first and second transfer signals $S_1$ and $S_2$. Consequently, signal charges are accumulated in the first and second semiconductor regions FD1 and FD2. That is, signal charges are accumulated in each of the first and second semiconductor regions FD1 and FD2 during the accumulation period.

Thereafter, in the reading period, the signal charges accumulated in the first and second semiconductor regions FD1 and FD2 are read out. At this time, the third transfer signals $S_{31}$ and $S_{32}$ applied to the third transfer electrodes $TX3_1$ and $TX3_2$ become high level, and a positive electric potential is supplied to the third transfer electrodes $TX3_1$ and $TX3_2$. Consequently, unnecessary charges are collected in the potential well of the third semiconductor regions $FD3_1$ and $FD3_2$. The first transfer signal $S_1$ and the third transfer signal $S_{31}$ have opposite phases. The second transfer signal $S_2$ and the third transfer signal $S_{32}$ have opposite phases.

An electric potential $V_{PG}$ supplied to the photo-gate electrodes PG1 and PG2 is set lower than electric potentials $V_{TX1}$, $V_{TX2}$, $V_{TX31}$, and $V_{TX32}$. When the first transfer signal $S_1$ or the second transfer signal $S_2$ becomes high level, a potential of the region immediately below the first transfer electrode TX1 becomes lower than a potential of the region immediately below the photo-gate electrode PG1. When the second transfer signal $S_2$ becomes high level, a potential of the region immediately below the second transfer electrode TX2 becomes lower than a potential of the region immediately below the photo-gate electrode PG2. When the third transfer signals $S_{31}$ and $S_{32}$ become high level, potentials of the region immediately below the third transfer electrodes $TX3_1$ and $TX3_2$ become lower than the potentials of the regions immediately below the photo-gate electrodes PG1 and PG2.

The electric potential $V_{PG}$ is set higher than the electric potentials at a time when the first transfer signal $S_1$, the second transfer signal $S_2$, and the third transfer signals $S_{31}$ and $S_{32}$ are low level. When the first transfer signal $S_1$ becomes low level, the potential of the region immediately below the first transfer electrode TX1 becomes higher than the potential of the region immediately below the photo-gate electrode PG1. When the second transfer signal $S_2$ becomes low level, the potential of the region immediately below the second transfer electrode TX2 becomes higher than the potential of the region immediately below the photo-gate electrode PG2. When the third transfer signals $S_{31}$ and $S_{32}$ become low level, the potentials of the region immediately below the third transfer electrodes $TX3_1$ and $TX3_2$ becomes higher than the potentials of the regions immediately below the photo-gate electrodes PG1 and PG2.

Figure 17:
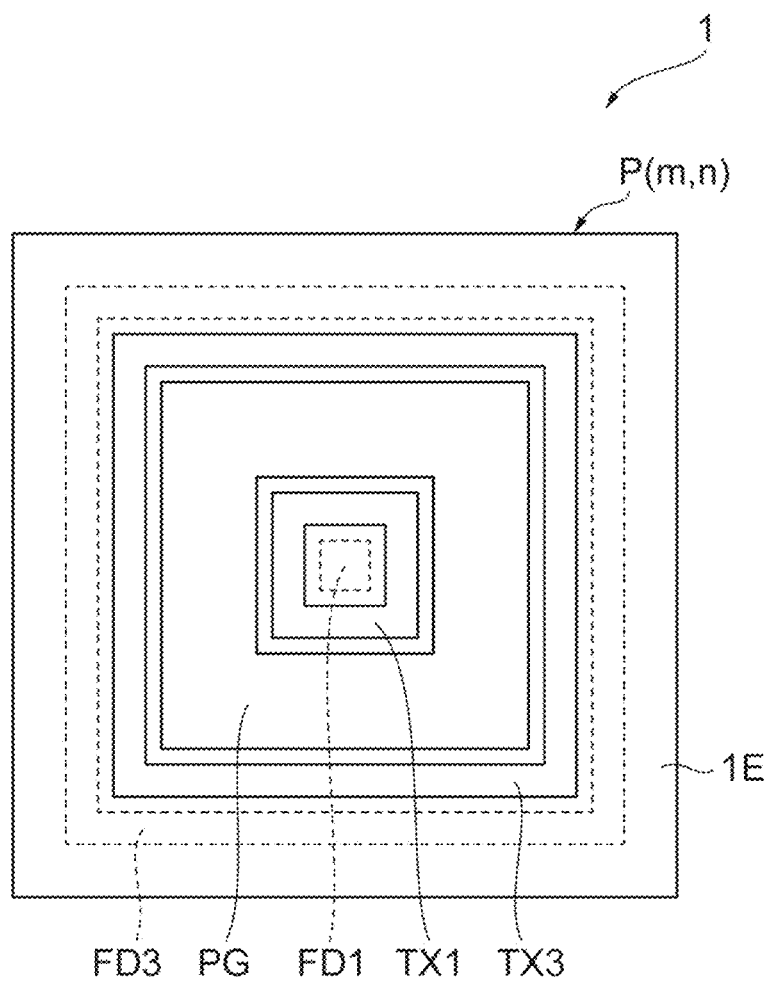
FIG. 17 is a schematic diagram illustrating a configuration of a pixel of a range image sensor according to a modification.

The modification illustrated in FIG. 17 is different from the modification illustrated in FIG. 13 in that one unit including the photo-gate electrode PG constitutes one pixel P(m, n). FIG. 17 is a schematic diagram illustrating a configuration of a pixel of a range image sensor according to the modification.

In each pixel P(m, n), the range image sensor of the present modification includes the photo-gate electrode PG, the first transfer electrode TX1, the third transfer electrode TX3, the first semiconductor region FD1, and the third semiconductor region FD3. A configuration of one unit constituting each pixel P(m, n) is the same as that of the first unit (or second unit) of the above-described modification.

Figure 18:
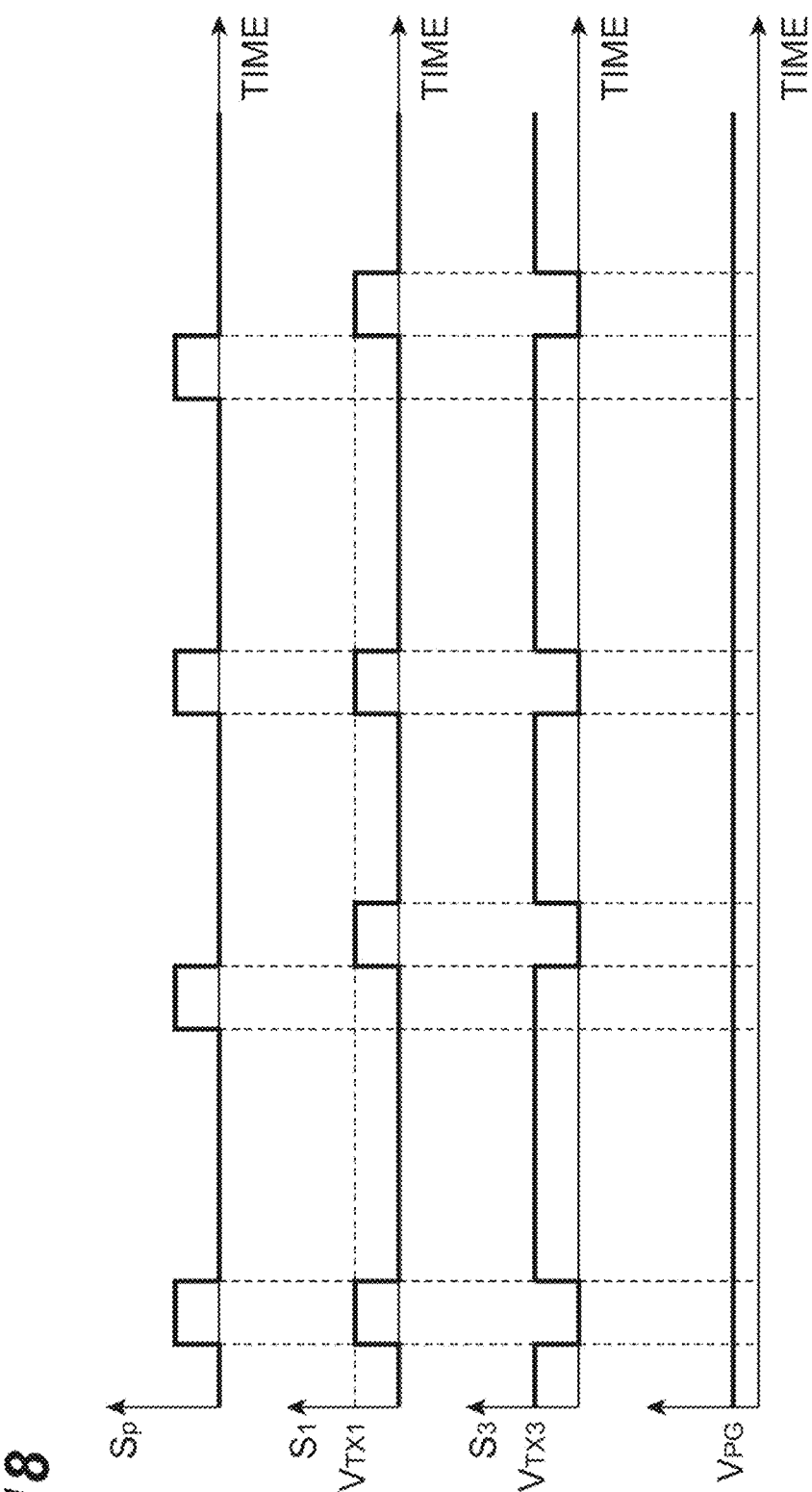
FIG. 18 is a timing chart of various signals.

FIG. 18 is a timing chart of various signals in the modification illustrated in FIG. 17.

As illustrated in FIG. 18, the first transfer signal $S_1$ applied to the first transfer electrode TX1 is intermittently given a phase shift at a predetermined timing. In the present modification, the first transfer signal $S_1$ is given a phase shift of 180° at a timing of 180°. The first transfer signal $S_1$ is synchronized with the drive signal $S_P$ at a timing of 0°, and has a phase difference of 180° with respect to the drive signal $S_P$ at a timing of 180°. The first transfer signal $S_1$ and the third transfer electrode TX3 have opposite phases.

In the present modification, signal charges accumulated in the first semiconductor region FD1 are read from the first semiconductor region FD1 as an output ($V_{out1}$) at a timing of 0°. At a timing of 180 degrees, signal charges accumulated in the first semiconductor region FD1 are read from the first semiconductor region FD1 as an output ($V_{out2}$). These outputs ($V_{out1}$, $V_{out2}$) correspond to the above-mentioned signal d'(m, n).

Figure 19:
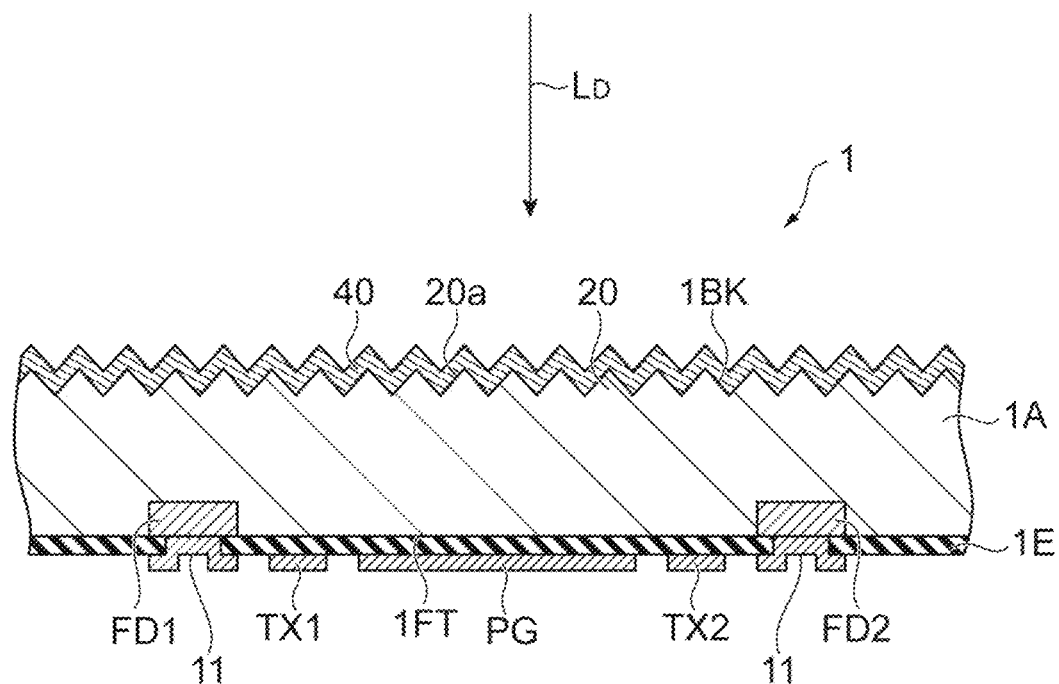
FIG. 19 is a diagram illustrating a cross-sectional configuration of each pixel of a range image sensor according to a modification.

In the modification illustrated in FIG. 19, a range image sensor 1 is different from the range image sensor 1 illustrated in FIG. 4 in that there is provided a film 40 containing boron. FIG. 19 is a diagram illustrating a cross-sectional configuration of each pixel of the range image sensor according to the modification.

The film 40 is disposed on the light incident surface 1BK and transmits incident light. The film 40 is in contact with the light incident surface 1BK. In the present modification, the film 40 is a film made of boron. The film 40 is in contact with the slope 20a in such a manner as to cover the slope 20a of the protrusion 20. On a surface of the film 40, an asperity corresponding to the plurality of protrusions 20 is formed. A thickness of the film 40 is, for example, 1 to 30 nm. The film 40 covers, for example, the entire region where the plurality of protrusions 20 is formed.

In the range image sensor 1 illustrated in FIG. 19, similarly to the range image sensor 1 illustrated in FIG. 4, spectral response in ultraviolet and near-infrared wavelength bands are enhanced.

In the present modification, since the film 40 containing boron is disposed on the light incident surface 1BK (light incident surface), deterioration of the spectral response in an ultraviolet wavelength band is suppressed.

Figure 20:
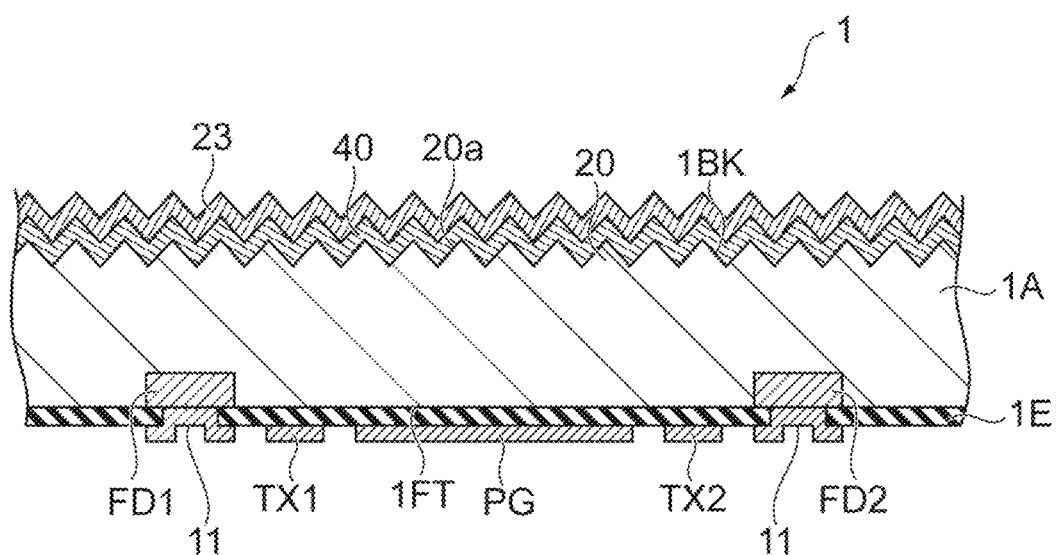
FIG. 20 is a diagram illustrating a cross-sectional configuration of each pixel of a range image sensor according to a modification.

In the modification illustrated in FIG. 20, a range image sensor 1 is different from the range image sensor 1 illustrated in FIG. 11 in that there is provided the film 40. FIG. 20 is a diagram illustrating a cross-sectional configuration of each pixel of the range image sensor according to the modification.

The aluminum oxide film 23 is disposed on the film 40. The aluminum oxide film 23 is in contact with the film 40. The aluminum oxide film 23 covers the entire film 40, for example. Also in the present modification, the film 40 is a film made of boron. A thickness of the aluminum oxide film 23 is, for example, 0.01 to 1 μm.

In the range image sensor 1 illustrated in FIG. 20, similarly to the range image sensor 1 illustrated in FIG. 11, spectral response in ultraviolet and near-infrared wavelength bands are enhanced. Also in the present modification, since the range image sensor 1 includes the aluminum oxide film 23, a fixed charge of positive polarity exists on the light incident surface 1BK side of the semiconductor substrate 1A. Consequently, also in the range image sensor 1 according to the present modification, the photodetection sensitivity is enhanced.

In the present modification, similarly to the range image sensor 1 illustrated in FIG. 19, since the film 40 containing boron is disposed on the light incident surface 1BK (light incident surface), deterioration of the spectral response in an ultraviolet wavelength band is suppressed.

Figure 21:
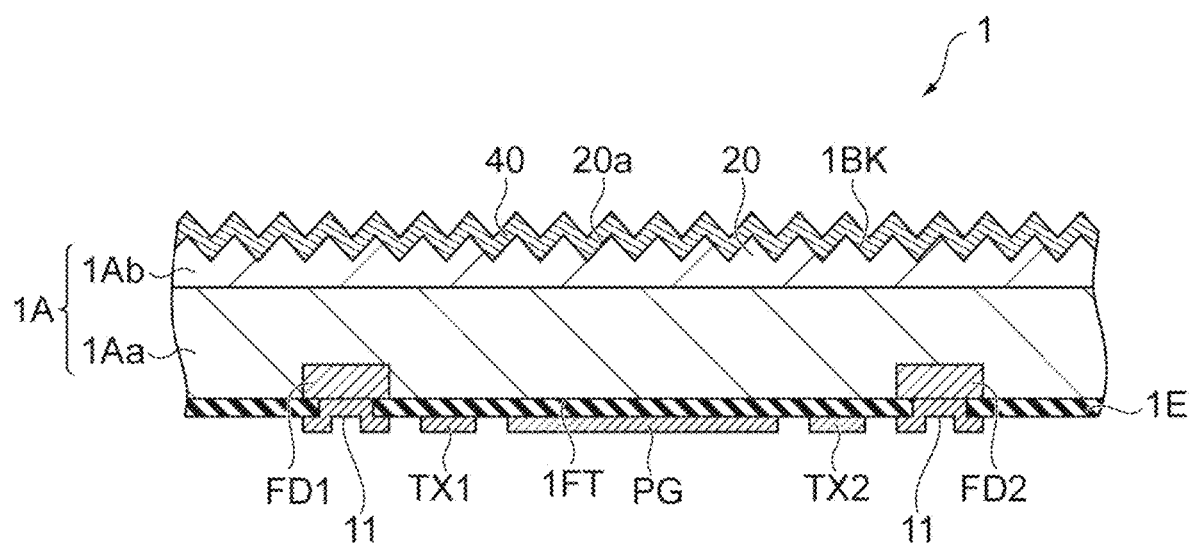
FIG. 21 is a diagram illustrating a cross-sectional configuration of each pixel of a range image sensor according to a modification.

In the modification illustrated in FIG. 21, a range image sensor 1 is different from the range image illustrated 1 illustrated in FIG. 12 in that there is provided the film 40. FIG. 21 is a diagram illustrating a cross-sectional configuration of each pixel of the range image sensor according to the modification.

In the range image sensor 1 illustrated in FIG. 21, similarly to the range image sensor 1 illustrated in FIG. 12, spectral response in ultraviolet and near-infrared wavelength bands are enhanced. Also in the present modification, since the film 40 containing boron is disposed on the light incident surface 1BK (light incident surface), deterioration of the spectral response in an ultraviolet wavelength band is suppressed.

In the modification illustrated in FIG. 22, a range image sensor 1 is different from the range image sensor 1 illustrated in FIG. 14 in that there is provided the film 40. FIG. 22 is a diagram illustrating a cross-sectional configuration of each pixel of the range image sensor according to the modification.

In the range image sensor 1 illustrated in FIG. 22, similarly to the range image sensor 1 illustrated in FIG. 14, spectral response in ultraviolet and near-infrared wavelength bands are enhanced. Also in the present modification, since the film 40 containing boron is disposed on the light incident surface 1BK (light incident surface), deterioration of the spectral response in an ultraviolet wavelength band is suppressed.

Although the embodiments of the present invention have been described above, the present invention is not necessarily limited to the above-described embodiments, and various modifications can be made without departing from the gist thereof.

The charge generation region in which charges are generated in response to incident light may be constituted by a photodiode (e.g., a implanted photodiode or the like). In the range image sensor 1, the pixels P(m, n) are not necessarily disposed two-dimensionally. For example, the pixels P(m, n) may be disposed one-dimensionally.

In the range image sensors 1 according to the present embodiments and the modifications, conductivity types of the p-type and n-type each may be interchanged in such a manner as to be opposite to the above-described conductivity types.

The range image sensor 1 may be a front-illuminated range image sensor.

INDUSTRIAL APPLICABILITY

The present invention is applicable to a range sensor and a range image sensor that include a silicon substrate.

REFERENCE SIGNS LIST 1 range image sensor
1A semiconductor substrate
1Aa first substrate region
1Ab second substrate region
1BK light incident surface
1FT front surface
20 protrusion
20a slope
21 anti-reflection film
23 aluminum oxide film
40 boron-containing film
FD1 first semiconductor region
FD2 second semiconductor region
P pixel
TX1 first transfer electrode
TX2 second transfer electrode

The invention claimed is:

1. A range image sensor comprising:
a silicon substrate provided with an imaging region including a plurality of units disposed one-dimensionally or two-dimensionally, wherein
each of the units is a range sensor,
the range sensor includes
- a silicon substrate including a first principal surface and a second principal surface opposing each other, and provided with a charge generation region configured to generate a charge in response to incident light, a charge collection region configured to collect the charge from the charge generation region, and an unnecessary-charge collection region configured to collect an unnecessary charge from the charge generation region, on the first principal surface side,
- a transfer electrode disposed between the charge generation region and the charge collection region on the first principal surface, and configured to cause the charge to flow from the charge generation region into the charge collection region in response to an inputted signal, and
- an unnecessary-charge transfer electrode disposed between the charge generation region and the unnecessary-charge collection region on the first principal surface, and configured to cause the unnecessary charge to flow from the charge generation region into the unnecessary-charge collection region in response to an inputted signal, a region of the second principal surface corresponding at least to the charge generation region is formed with a plurality of protrusions including a slope inclined with respect to a thickness direction of the silicon substrate,
a (111) plane of the silicon substrate is exposed as the slope at the protrusion,
a height of the protrusion is equal to or more than 200 nm,
the transfer electrode has an approximately ring shape and is disposed to surround the charge collection region when viewed from a direction orthogonal to the first principal surface,
the charge generation region has an approximately ring shape and is disposed to surround the transfer electrode when viewed from the direction orthogonal to the first principal surface,
the unnecessary-charge transfer electrode has an approximately ring shape and is disposed to surround the charge generation region when viewed from the direction orthogonal to the first principal surface, and
the unnecessary-charge collection region has an approximately ring shape and is disposed to surround the unnecessary-charge transfer electrode when viewed from the direction orthogonal to the first principal surface.

2. The range image sensor according to claim 1, further comprising
a silicon oxide film disposed on the second principal surface and configured to transmit the incident light.

3. The range image sensor according to claim 1, further comprising
an aluminum oxide film disposed on the second principal surface and configured to transmit the incident light.

4. The range image sensor according to claim 1, wherein
the silicon substrate includes
a first substrate region provided with the charge generation region and the charge collection region and
a second substrate region having a higher impurity concentration than the first substrate region, and provided on the second principal surface side; and
the slope of the protrusion is included in a surface of the second substrate region.

5. The range image sensor according to claim 1, further comprising
a film disposed on the second principal surface, configured to transmit the incident light, and containing boron.

* * * * *